United States Patent
Kato et al.

(10) Patent No.: US 10,450,527 B2
(45) Date of Patent: Oct. 22, 2019

(54) LOW-FRICTION COATING PRODUCTION METHOD AND SLIDING METHOD

(71) Applicants: JTEKT CORPORATION, Osaka-shi, Osaka (JP); THE UNIVERSITY OF TOKYO, Tokyo (JP)

(72) Inventors: Takahisa Kato, Tokyo (JP); Masataka Nosaka, Tokyo (JP); Mamoru Tohyama, Nagakute (JP); Masahiro Suzuki, Kashiba (JP)

(73) Assignees: JTEKT CORPORATION, Osaka-shi (JP); THE UNIVERSITY OF TOKYO, Tokyo (JP)

(*) Notice: Subject to any disclaimer, the term of this patent is extended or adjusted under 35 U.S.C. 154(b) by 0 days.

(21) Appl. No.: 15/547,728

(22) PCT Filed: Jan. 29, 2016

(86) PCT No.: PCT/JP2016/052680
§ 371 (c)(1),
(2) Date: Jul. 31, 2017

(87) PCT Pub. No.: WO2016/121937
PCT Pub. Date: Aug. 4, 2016

(65) Prior Publication Data
US 2017/0362711 A1 Dec. 21, 2017

(30) Foreign Application Priority Data

Jan. 29, 2015 (JP) .................... 2015-015850
Jan. 29, 2015 (JP) .................... 2015-015851
(Continued)

(51) Int. Cl.
*C23C 16/26* (2006.01)
*C10M 105/04* (2006.01)
(Continued)

(52) U.S. Cl.
CPC ............. *C10M 105/04* (2013.01); *B05D 5/08* (2013.01); *C10M 103/02* (2013.01);
(Continued)

(58) Field of Classification Search
CPC ......... C23C 16/22; C23C 16/06; C23C 16/26; C23C 16/50
See application file for complete search history.

(56) References Cited

U.S. PATENT DOCUMENTS 5,115,007 A * 5/1992 Chihara ................. C08G 18/10
428/424.2
5,629,082 A * 5/1997 Baureis .................. B32B 15/08
428/306.6
(Continued)

FOREIGN PATENT DOCUMENTS

CN 101578389 A 11/2009
CN 103228817 A 7/2013
(Continued)

OTHER PUBLICATIONS

Berman, Diana, et al., "Few layer graphene to reduce wear and friction on sliding steel surfaces". Carbon 54 (2013) 454-459.*
(Continued)

*Primary Examiner* — Bret P Chen
(74) *Attorney, Agent, or Firm* — Oliff PLC

(57) ABSTRACT

A method including substituting an atmosphere in a space, in which a sliding surface formed of a metal or a ceramic material, and a slid surface are disposed, with a gas atmosphere containing a hydroxyl group-containing compound and at least one of hydrogen and nitrogen, and relatively sliding the sliding surface against the slid surface by a Hertzian contact stress of 1.0 GPa or more in the space under the gas atmosphere containing the hydroxyl group-containing compound at least one of hydrogen and nitrogen. As a
(Continued)

result, it is possible to form, on the sliding surface, a low-friction coating that stably exhibits a significantly low friction coefficient, for example, of $10^{-4}$ order (less than 0.001).

24 Claims, 28 Drawing Sheets

(30) Foreign Application Priority Data

Jan. 19, 2016 (JP) .................. 2016-008236
Jan. 19, 2016 (JP) .................. 2016-008237

(51) Int. Cl.

| | |
|---|---|
| C10M 103/02 | (2006.01) |
| C23C 16/50 | (2006.01) |
| B05D 5/08 | (2006.01) |
| C10M 105/06 | (2006.01) |
| C10M 105/08 | (2006.01) |
| C10M 177/00 | (2006.01) |
| C10M 109/02 | (2006.01) |
| C23C 16/44 | (2006.01) |
| F16C 17/00 | (2006.01) |
| F16C 33/12 | (2006.01) |

(52) U.S. Cl.
CPC ........ *C10M 105/06* (2013.01); *C10M 105/08* (2013.01); *C10M 109/02* (2013.01); *C10M 177/00* (2013.01); *C23C 16/26* (2013.01); *C23C 16/44* (2013.01); *C23C 16/50* (2013.01); *F16C 17/00* (2013.01); *F16C 33/121* (2013.01); *C10M 2201/0413* (2013.01); *C10M 2203/0206* (2013.01); *C10M 2203/065* (2013.01); *C10N 2230/06* (2013.01); *C10N 2250/08* (2013.01); *C10N 2250/121* (2013.01); *F16C 2206/02* (2013.01); *F16C 2206/48* (2013.01)

(56) References Cited

U.S. PATENT DOCUMENTS

| | | | |
|---|---|---|---|
| 6,354,008 | B1 | 3/2002 | Domoto et al. |
| 8,322,265 | B1* | 12/2012 | Singer ............ F42B 5/15 |
| | | | 124/3 |
| 2002/0022129 | A1 | 2/2002 | Moronuki |
| 2005/0064196 | A1 | 3/2005 | Martin et al. |
| 2006/0210833 | A1 | 9/2006 | Saito et al. |
| 2006/0263604 | A1 | 11/2006 | Martin et al. |
| 2007/0060483 | A1 | 3/2007 | Konishi et al. |
| 2007/0078067 | A1 | 4/2007 | Nakagawa et al. |
| 2007/0249507 | A1* | 10/2007 | Okamoto ........... C23C 14/0605 |
| | | | 508/113 |
| 2008/0146468 | A1 | 6/2008 | Konishi et al. |
| 2008/0188383 | A1 | 8/2008 | Iseki et al. |
| 2008/0254217 | A1 | 10/2008 | Boroson |
| 2009/0186783 | A1 | 7/2009 | Martin et al. |
| 2010/0314005 | A1 | 12/2010 | Saito et al. |
| 2012/0248711 | A1* | 10/2012 | Iwashita ........... C23C 14/0605 |
| | | | 277/444 |
| 2012/0308949 | A1 | 12/2012 | Hirose et al. |
| 2013/0036935 | A1* | 2/2013 | Bauer ............... E01B 25/32 |
| | | | 104/286 |
| 2013/0190216 | A1 | 7/2013 | Martin et al. |
| 2013/0252860 | A1 | 9/2013 | Komori |
| 2014/0128298 | A1* | 5/2014 | Becker ............. C23C 14/021 |
| | | | 508/107 |

FOREIGN PATENT DOCUMENTS

| | | | |
|---|---|---|---|
| JP | 2000-144378 A | 5/2000 | |
| JP | 2002-097573 A | 4/2002 | |
| JP | 2004-155146 A | 6/2004 | |
| JP | 2005-97570 A | 4/2005 | |
| JP | 2005-098495 A | 4/2005 | |
| JP | 2005-145720 A | 6/2005 | |
| JP | 2006-144100 A | 6/2006 | |
| JP | 2006-291355 A | 10/2006 | |
| JP | 2007-32360 * | 2/2007 | ............ F04B 39/00 |
| JP | 2007-099947 A | 4/2007 | |
| JP | 2008-522020 A | 6/2008 | |
| JP | 2010-525163 A | 7/2010 | |
| JP | 2012-092351 A | 5/2012 | |
| JP | 2012-246545 A | 12/2012 | |
| WO | WO 2004/029329 A1 * | 4/2004 | ............ C23C 26/00 |

OTHER PUBLICATIONS

Peng, Bo Yuan, et al., "Effects of Surface Coating Preparation and Sliding Modes on Titanium Oxide Coated Titanium Alloy for Aerospace Applications". International Journal of Aerospace Engineering, vol. 2014, Article ID 640364, 10 pages, May 6, 2014.*
Bachmann, Svenja, et al., "Ultra-Low Friction on Tetrahedral Amorphous Diamond-Like Carbon (ta-C) Lubricated with Ethylene Glycol". Lubricants 2018, 6, 59, pp. 1-14.*
Zhang, Renhui, et al., "Low friction of diamond sliding against Al2O3 ceramic ball based on the first principles calculations". Surface & Coatings Technology 283 (2015) 129-134.*
Mar. 8, 2016 International Search Report issued in International Patent Application No. PCT/JP2016/052679.
Mar. 8, 2016 Written Opinion of the International Searching Authority issued in International Patent Application No. PCT/JP2016/052679.
Mar. 8, 2016 International Search Report issued in International Patent Application No. PCT/JP2016/052680.
Mar. 8, 2016 Written Opinion of the International Searching Authority issued in International Patent Application No. PCT/JP2016/052680.
U.S. Appl. No. 15/547,754, filed Jul. 31, 2017 in the name of Kato et al.
Jan. 24, 2019 Office Action issued in Chinese Patent Application No. 201680008136.4.
Apr. 18, 2018 Office Action issued in U.S. Appl. No. 15/547,754.
Maitland Jones, Jr.,"Jones's Organic Chemistry," 3rd Edition, Mar. 2006, pp. 714-715, vol. 2, Tokyo Kagaku Dojin, Tokyo, Japan.
Jul. 11, 2019 Information Offer Form issued in Japanese Patent Application No. 2016-008236.
Jul. 24, 2019 Information Offer Form issued in Japanese Patent Application No. 2016-008237.
Chen Xinchun, "Structural and Environmental Dependence of Superlubricity in Ion Vapor Deposited Hydrogenated Amorphous Carbon Films." Aug. 2014, The University of Tokyo, Tokyo, Japan.

* cited by examiner

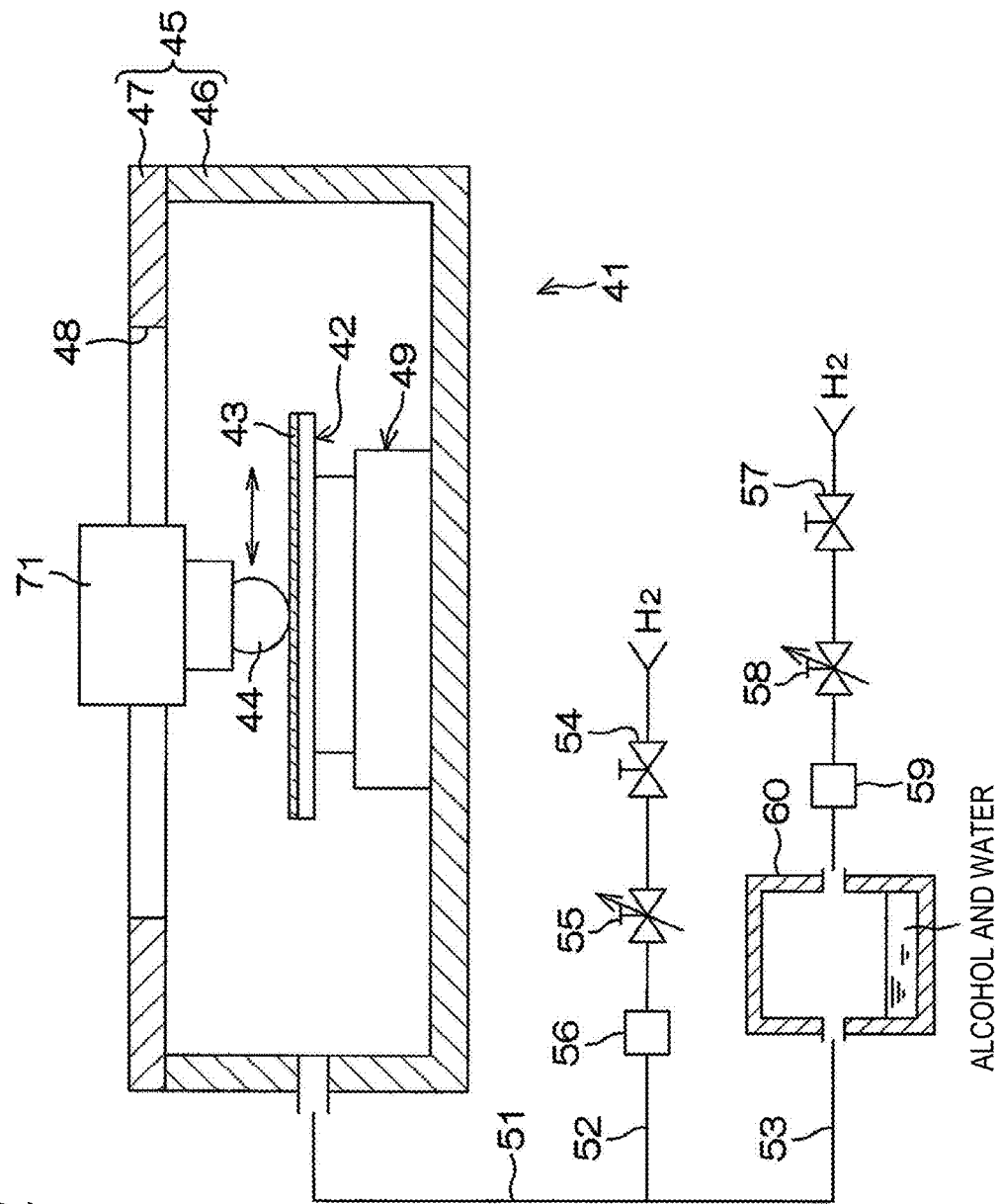

| DLC composite films | HARD CARBON BASED FILM | |
|---|---|---|
| | Si-DLC | PLC |
| Deposition pressure, Pa | 0.28 | 0.24 |
| Bias voltage, kV | -2.0 | -0.4 |
| Heater temperature, K | 503 | |
| Film thickness, nm | 275 | 100 |
| Indentation hardness, GPa | 12.6 | |
| Young's modulus, GPa | 141 | |
| G-peak position, cm⁻¹ | 1521 | |
| FWHM(G), cm⁻¹ | 181 | |
| I(D)/I(G) | 0.49 | |
| Estimated hydrogen content, at.% | 11 | |

METHANOL (MASS% CONCENTRATION 4.8%)
WATER OF 20 cc AND METHANOL OF 1 cc

METHANOL (MASS% CONCENTRATION 9.1%)
WATER OF 10 cc AND METHANOL OF 1 cc

METHANOL (MASS% CONCENTRATION 16.7%)
WATER OF 10 cc AND METHANOL OF 2 cc

METHANOL (MASS% CONCENTRATION 50%)
WATER OF 10 cc AND METHANOL OF 10 cc

ETHANOL (MASS% CONCENTRATION 9.1%)
WATER OF 10 cc AND ETHANOL OF 1 cc

ETHANOL (MASS% CONCENTRATION 16.7%)
WATER OF 10 cc AND ETHANOL OF 2 cc

ETHANOL (MASS% CONCENTRATION 23.1%)
WATER OF 10 cc AND ETHANOL OF 3 cc

ETHANOL (MASS% CONCENTRATION 33.3%)
WATER OF 10 cc AND ETHANOL OF 5 cc

ETHANOL (MASS% CONCENTRATION 50%)
WATER OF 10 cc AND ETHANOL OF 10 cc

METHANOL (MASS% CONCENTRATION 23.1%)
WATER OF 10 cc AND METHANOL OF 3 cc

■FFO
GENERATED AT 19.6 N → LOST AT 19.6 N
GENERATED AT 33.3 N → LOST AT 56.8 N

ETHANOL (MASS% CONCENTRATION 23.1%)
WATER OF 10 cc AND ETHANOL OF 3 cc

■FFO  GENERATED AT 35.3 N
→ LOST AFTER FRICTION FOR 15 MINUTES AT 63.7 N

1-PROPANOL (MASS% CONCENTRATION 23.1%)
WATER OF 10 cc AND 1-PROPANOL OF 3 cc

■FFO  GENERATED AT 35.3 N
→ LOST AFTER FRICTION FOR 15 MINUTES AT 63.7 N

FIG. 24

| Surface layer | PLC | H-PLC | O-PLC |
|---|---|---|---|
| Source gas | C7H8 5sccm | C7H8 4sccm H2 16sccm | C7H8 5sccm O2 5sccm |
| Coating time [min] | 15 | 120 | 15 |
| Heater temperature [°C] | 230 | | |
| Bias voltage [kV] | -4.0 | | |

| Test No. | Run-in environment | | | FFO environment | | |
|---|---|---|---|---|---|---|
| | Main flow | Sub flow 1 | Sub flow 2 | Main flow | Sub flow 1 | Sub flow 2 |
| 14 | N2 5 slm | 23%@ 180 sccm | — | N2 5 slm | 23%@ 80→17sccm | 100%@ 0.1→0.3sccm |

FIG. 27A

| Test No. | Run-in environment | | | FFO environment | | |
|---|---|---|---|---|---|---|
| | Main flow | Sub flow 1 | Sub flow 2 | Main flow | Sub flow 1 | Sub flow 2 |
| 15 | H2 4.3 slm | — | H2O 40→0 sccm | H2 4.3 slm | — | — |
| 16 | H2 4.3 slm | — | H2O 40 sccm | H2 4.3 slm | — | H2O 40→10 sccm |

FIG. 27B

| Test No. | Surface | ZrO2 pin | Friction environment | FFO duration at 63.7 N without tribofilm rupture |
|---|---|---|---|---|
| 15 | PLC | ZrO2 (annealed) | H2 | 1h (19.6N) |
| 16 | | | | 1h (39.2N) |

FIG. 30A

| Test No. | Run-in environment | | | FFO environment | | |
|---|---|---|---|---|---|---|
| | Main flow | Sub flow 1 | Sub flow 2 | Main flow | Sub flow 1 | Sub flow 2 |
| 17 | H₂ 4.3 slm | — | 100%@ 2 sccm | H₂ 4.3 slm | — | 100%@ 1 sccm |

FIG. 30B

| Test No. | Surface | ZrO₂ pin | Friction environment | FFO duration at 63.7 N without tribofilm rupture |
|---|---|---|---|---|
| 17 | PLC | ZrO₂ | H₂ | 1h |

FIG. 32

| Test No. | PLC Film | ZrO2 pin | Friction environment | Run-in process | | FFO duration at 63.7 N without tribofilm rupture |
|---|---|---|---|---|---|---|
| | | | | Load, N | Added vapors | |
| 18 | O-PLC | ZrO2 | H2 | 19.6 (13min) | 100%@40sccm H2O 10sccm | 2h以上 |
| 19 | PLC | | | 19.6 (23min) | 23%@180sccm 100%@2sccm | 2h以上 |
| 20 | H-PLC | | | 19.6-63.7 (30min) | 23%@180sccm | 4h以上 |

LOW-FRICTION COATING PRODUCTION METHOD AND SLIDING METHOD

TECHNICAL FIELD

The present invention relates to a low-friction coating production method for producing a low-friction coating, and a sliding method for sliding a sliding surface against an amorphous carbon based film.

BACKGROUND ART

In order to reduce friction of a sliding system, it has been proposed to dispose a solid lubricant film on a sliding surface of a sliding member. For example, a DLC (Diamond Like Carbon) film is known as such a solid lubricant film. The following Patent Literature 1 discloses a low-friction sliding mechanism by which a low-friction agent composition containing an oxygen-containing organic compound or a fatty amine compound is supplied to a sliding surface including a DLC film.

In addition, the following Patent Literature 2 discloses a low-friction lubrication assembly including a first member having a first sliding surface, and a second member having a second sliding surface. The first sliding surface has chemical affinity to O—H groups. The second sliding surface has an O—H terminal sliding surface. An oxygen-containing organic compound (liquid lubricant) is supplied between the first and second sliding surfaces so that a tribo-film with hydrogen as a terminal can be formed between the first and second sliding surfaces.

RELATED ART DOCUMENTS

Patent Documents

Patent Literature 1: JP-A-2005-98495
Patent Literature 2: JP-A-2012-92351

SUMMARY OF THE INVENTION

Problem to be Solved by the Invention

In the low-friction sliding mechanism disclosed in Patent Literature 1 and the low-friction lubrication assembly disclosed in Patent Literature 2, it is intended to reduce a friction coefficient of a sliding portion.

However, in Patent Literature 1 and Patent Literature 2, sliding is performed in a state (fluid lubrication) where a liquid lubricant is supplied onto a sliding surface. That is, in Patent Literature 1 and Patent Literature 2, friction reduction cannot be provided in conditions (dry lubrication) where a lubricant such as a liquid lubricant is not used additionally.

It is requested to reduce the friction coefficient of the sliding surface (sliding portion) without using any additional lubricant. Further, it is desired to produce a state of a low friction coefficient in the sliding surface stably.

Therefore, an object of the invention is to provide a low-friction coating production method for producing a low-friction coating providing a low friction coefficient stably, and a sliding method capable of stably achieving sliding in a state of a low friction coefficient.

Means for Solving the Problem

A first configuration of the invention provides a method for producing a low-friction coating (5), including: a substitution step of substituting an atmosphere in a space (10), in which, a sliding surface (6) formed of metal or ceramics, a slid surface (7) including an amorphous carbon based film (9) being disposed in the space (10) are disposed, to a gas atmosphere containing a hydroxyl group containing compound and at least one of hydrogen and nitrogen; and a sliding step of relatively sliding the sliding surface against the slid surface due to Hertzian contact stress of 1.0 GPa or more in a state where the gas atmosphere containing the hydroxyl group containing compound and at least one of hydrogen and nitrogen has been set in the space; wherein: the low-friction coating is formed on the sliding surface by the sliding step.

Incidentally, numerical characters etc. in parentheses designate corresponding constituent elements etc. in embodiments which will be described later. Not to say, this does not mean that the invention should be limited to those embodiments. The same thing can be applied to the following configurations.

A second configuration of the invention provides a low-friction coating production method according to the first configuration, wherein the hydroxyl group containing compound includes a hydrocarbon based substance.

A third configuration of the invention provides a low-friction coating production method according to the second configuration, wherein the hydrocarbon based substance includes alcohol.

A fourth configuration of the invention provides a low-friction coating production method according to the third configuration, wherein the alcohol includes methanol ($CH_3OH$).

A fifth configuration of the invention provides a low-friction coating production method according to the fourth configuration, wherein the hydroxyl group containing compound further contains water, and the gas atmosphere contains gaseous methanol and gaseous steam generated from a solution in which vol % concentration of liquid methanol to the liquid methanol and liquid water is 6% to 15%. Incidentally, the "vol % concentration of liquid methanol to the liquid methanol and liquid water" designates a volume of liquid methanol alone which has not been mixed yet relative to a total value of the volume of the liquid methanol which has not been mixed yet and a volume of liquid water alone which has not been mixed yet. In the same manner, "vol % concentration of liquid ethanol to the liquid ethanol and liquid water" designates a volume of liquid ethanol alone which has not been mixed yet relative to a total value of the volume of the liquid ethanol which has not been mixed yet and a volume of liquid water alone which has not been mixed yet. In the same manner, "vol % concentration of liquid alcohol to the liquid alcohol and liquid water" designates a volume of liquid alcohol alone which has not been mixed yet relative to a total value of the volume of the liquid alcohol which has not been mixed yet and a volume of liquid water alone which has not been mixed yet. In the same manner, "vol % concentration of liquid 1-propanol to the liquid 1-propanol and liquid water" designates a volume of liquid 1-propanol alone which has not been mixed yet relative to a total value of the volume of the liquid 1-propanol which has not been mixed yet and a volume of liquid water alone which has not been mixed yet. In the same manner, "vol % concentration of liquid 2-propanol to the liquid 2-propanol and liquid water" designates a volume of liquid 2-propanol alone which has not been mixed yet relative to a total value of the volume of the liquid 2-propanol which has not been mixed yet and a volume of liquid water alone which has not been mixed yet.

A sixth configuration of the invention provides a low-friction coating production method according to the third configuration, wherein the alcohol includes ethanol ($C_2H_5OH$).

A seventh configuration of the invention provides a low-friction coating production method according to the sixth configuration, wherein the hydroxyl group containing compound further contains water, and the gas atmosphere contains gaseous ethanol and gaseous steam generated from a solution in which vol % concentration of liquid ethanol to the liquid ethanol and liquid water is 6% to 30%.

An eighth configuration of the invention provides a low-friction coating production method according to the seventh configuration, wherein the gas atmosphere contains gaseous ethanol and gaseous steam generated from a solution in which vol % concentration of the liquid ethanol to the liquid ethanol and the liquid water is 15% to 25%.

A ninth configuration of the invention provides a low-friction coating production method according to the third configuration, wherein the alcohol includes 1-propanol ($CH_3CH_2CH_2OH$).

A tenth configuration of the invention provides a low-friction coating production method according to the third configuration, wherein the alcohol includes 2-propanol ($CH_3CH(OH)CH_3$).

An eleventh configuration of the invention provides a low-friction coating production method according to any one of the third, fourth, sixth, ninth and tenth configurations, wherein the hydroxyl group containing compound is gaseous alcohol generated from a solution containing the alcohol at a ratio of 100%.

A twelfth configuration of the invention provides a low-friction coating production method according to any one of the first to tenth configurations, wherein the hydroxyl group containing compound contains water.

A thirteenth configuration of the invention provides a low-friction coating production method according to any one of the first to twelfth configurations, wherein the Hertzian contact stress is 1.3 GPa to 2.4 GPa.

A fourteenth configuration of the invention provides a low-friction coating production method according to any one of the first to thirteenth configurations, wherein the amorphous carbon based film contains short-chain polyacetylene based molecules as major component.

A fifteenth configuration of the invention provides a low-friction coating production method according to any one of the first to fourteenth configurations, wherein the amorphous carbon based film includes a coating formed by an ionization vapor deposition method with a bias voltage applied thereto under an atmosphere environment of hydrocarbon based gas.

A sixteenth configuration of the invention provides a low-friction coating production method according to the fifteenth configuration, wherein the amorphous carbon based film includes a coating formed by an ionization vapor deposition method with a high bias voltage applied thereto under an atmosphere environment of hydrocarbon based gas, and at least one of hydrogen and oxygen is added to the amorphous carbon based film.

A seventeenth configuration of the invention provides a low-friction coating production method according to any one of the first to sixteenth configurations, wherein the sliding member is formed of $ZrO_2$.

An eighteenth configuration of the invention provides a low-friction coating production method according to any one of the first to seventeenth configurations, further including: a supply step of supplying the hydroxyl group containing compound into the space, and a supply stop step of stopping supplying the hydroxyl group containing compound into the space after starting the sliding step.

A nineteenth configuration of the invention provides a low-friction coating production method according to any one of the first to eighteenth configurations, further including: a step of alternately repeating a supply state of supplying the hydroxyl group containing compound into the space, and a supply stop state of stopping supplying the hydroxyl group containing compound into the space, the step being performed in parallel with the sliding step.

A twentieth configuration of the invention provides a sliding method including: a substitution step of substituting an atmosphere in a space (10), in which a sliding surface (6) formed of metal or ceramics and a slid surface (7) being disposed in the space (10) are disposed, to a gas atmosphere containing a hydroxyl group containing compound and at least one of hydrogen and nitrogen; and a sliding step of relatively sliding the sliding surface against the slid surface due to Hertzian contact stress of 1.0 GPa or more in a state where the atmosphere in the space has been substituted to the gas atmosphere containing the hydroxyl group containing compound and at least one of hydrogen and nitrogen.

A twenty-first configuration of the invention provides a low-friction coating production method according to the fourth configuration, wherein the hydroxyl group containing compound further contains water, the methanol flows in a gaseous state due to first carrier gas, the water flows in a gaseous state due to second carrier gas, and a ratio of a flow rate of the first carrier gas including the gaseous methanol to a total of the flow rate of the first carrier gas including the gaseous methanol and a flow rate of the second carrier gas including the gaseous water is 6% to 15%.

A twenty-second configuration of the invention provides a low-friction coating production method according to the sixth configuration, wherein the hydroxyl group containing compound further contains water, the ethanol flows in a gaseous state due to first carrier gas, the water flows in a gaseous state due to second carrier gas, and a ratio of a flow rate of the first carrier gas including the gaseous ethanol to a total of the flow rate of the first carrier gas including the gaseous ethanol and a flow rate of the second carrier gas including the gaseous water is 6% to 30%.

A twenty-third configuration of the invention provides a low-friction coating production method according to the twenty-second configuration, wherein the ratio of the flow rate of the first carrier gas including the gaseous ethanol to the total of the flow rate of the first carrier gas including the gaseous ethanol and the flow rate of the second carrier gas including the gaseous water is 15% to 25%.

Advantages of the Invention

According to the invention, a sliding surface formed of metal or ceramics is slid against a slid surface by Hertzian contact stress of 1.0 GPa or more under an atmosphere environment containing a hydroxyl group containing compound and at least one of hydrogen and nitrogen. In this manner, a low-friction coating providing a low friction coefficient stably can be formed on the sliding surface. To say other words, it is possible to achieve sliding in a low friction coefficient state stably.

BRIEF DESCRIPTION OF THE DRAWINGS

FIG. 4 is a schematic sectional view showing a configuration of a first friction tester.

FIG. 24 is a table for explaining upper layers of plate test pieces to be measured in fourteenth to twentieth friction tests.

FIG. 25 is a table for explaining test conditions in the fourteenth friction test.

FIGS. 27A and 27B are tables for explaining test conditions in the fifteenth and sixteenth friction tests.

FIGS. 30A and 30B are tables for explaining test conditions in the seventeenth friction test.

FIG. 32 is a table for explaining test conditions in the eighteenth, nineteenth and twentieth friction tests.

MODE FOR CARRYING OUT THE INVENTION

An embodiment of the invention will be described in detail below with reference to the accompanying drawings.

Figure 1:
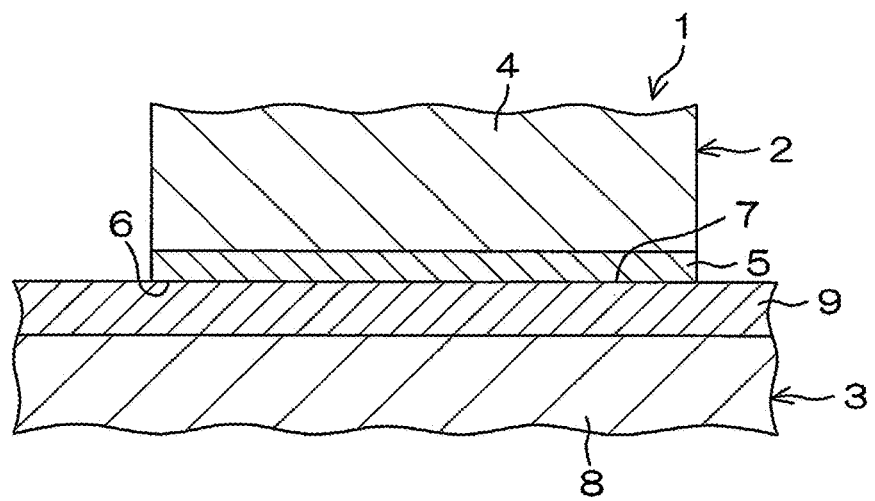
FIG. 1 is an enlarged sectional view showing a main portion of a sliding system obtained by a low-friction coating production method according to an embodiment of the invention.

FIG. 1 is an enlarged sectional view showing a main portion of a sliding system 1 obtained by a low-friction coating production method according to the embodiment of the invention. The sliding system 1 includes a sliding member 2, and a slid member 3 that is a mating material with the sliding member 2. The sliding member 2 is provided so that the sliding member 2 can slide relatively to the slid member 3. As for the sliding member 2 and the slid member 3, only the sliding member 2 may be slid (moved) against the slid member 3 standing still, or only the slid member 3 may be slid (moved) against the sliding member 2 standing still. Alternatively, both the sliding member 2 and the slid member 3 may be moved to slid the sliding member 2 relatively to the slid member 3.

The sliding member 2 includes a first substrate 4 having a surface (lower surface in FIG. 1), and a low-friction coating 5 with which at least a part of the surface of the first substrate 4 is covered. The first substrate 4 is formed of oxide ceramics (ceramics) or metal. For example, the oxide ceramics includes $ZrO_2$ (more specifically, yttrium-stabilized zirconia (YSZ)). The $ZrO_2$ may be subjected to heat treatment or not subjected to heat treatment. For example, the metal includes at least one of palladium (Pd) and SUJ2 (high-carbon chromium bearing-steel material). The oxide ceramics and the metal have catalytic properties capable of dissociating and adsorbing hydrogen molecules under a hydrogen atmosphere environment to thereby generate active hydrogen ($H^+$).

The low-friction coating 5 is an amorphous hydrocarbon based film. The low-friction coating 5 contains an aliphatic hydrocarbon group (such as an alkyl group), a carbonyl group (—C(=O)—), an aromatic component ($C_7H_7^+$), and a condensed ring based component ($C_9H_7^+$). The aliphatic hydrocarbon group shows a peak in a region of 2,900 $cm^{-1}$ to 3,000 $cm^{-1}$ in an infrared absorption spectrum (microscope transmission method). The carbonyl group shows a peak in a region of 1,650 $cm^{-1}$ to 1,800 $cm^{-1}$ in an infrared absorption spectrum (microscope transmission method). The aromatic component ($C_7H_7^+$) shows a peak at a mass of 91.1 in a positive ion spectrum obtained by TOF-SIMS (Time-Of-Flight Secondary Ion Mass Spectrometry). The condensed ring based component ($C_9H_7^+$) shows a peak at a mass of 115.2 in a positive ion spectrum obtained by TOF-SIMS. The low-friction coating 5 functions as a sliding surface 6 sliding against a slid surface 7 of the slid member 3.

Film thickness (average thickness) of the low-friction coating 5 is 2 nm to 1,000 nm. The film thickness is more preferably 2 nm to 500 nm.

The slid member 3 includes a second substrate 8 having a surface (upper surface in FIG. 1), and a PLC (Polymer-Like Carbon) film (amorphous carbon based film) 9 with which at least a part of the surface of the second substrate 8 is covered. The second substrate 8 is formed of a steel material such as tool steel, carbon steel, stainless steel, chrome molybdenum steel, or high-carbon chromium bearing steel.

The PLC film 9 is an amorphous carbon based film, which contains short-chain polyacetylene based molecules as major component. The PLC film 9 is a coating formed by an ionization vapor deposition method with a low bias voltage or a high bias voltage applied thereto under an atmosphere environment of hydrocarbon based gas (such as toluene ($C_7H_8$)). The PLC film 9 has a Young's modulus of 200 GPa to 250 GPa. The outermost surface of the PLC film 9 shows a peak in a region of 3,000 $cm^{-1}$ to 4,000 $cm^{-1}$ in an infrared absorption spectrum (microscope transmission method). When an amorphous carbon based film is produced with a high bias voltage applied thereto, at least one of hydrogen and oxygen may be added to the amorphous carbon based film. The PLC film 9 functions as the slid surface 7 slidably contacting the sliding surface 6 of the sliding member 2. The sliding surface 6 and the slid surface 7 may be flat surfaces as shown in FIG. 1, or may be spherical surfaces or other surfaces.

No lubricant such as liquid lubricant is supplied to a sliding interface between the sliding surface 6 and the slid surface 7 (that is, between the low-friction coating 5 and the PLC film 9). That is, in the sliding system 1, sliding operation is carried out under non-lubrication conditions.

Examples of the sliding system 1 may include a bearing, a seal, a flywheel, scissors, a plunger pump, an artificial joint, etc. In addition, examples of the bearing may include a ball bearing, a roller bearing such as a tapered roller bearing, a bearing with separators, a slide bearing, etc.

When a ball bearing is used as the sliding system 1, the slid surface 7 where the PLC film 9 is disposed may include an inner surface of a cage, and the sliding surface 6 may include external surfaces of balls made of oxide ceramic (such as $ZrO_2$) or metal (such as SUJ2 or palladium). When an outer ring guide type ball bearing in which an outer diameter of a cage is guided by an inner circumference of an outer ring or an inner ring guide type ball bearing in which an inner diameter of a cage is guided by an outer circumference of an inner ring is used, the slid surface 7 where the PLC film 9 is disposed may include a guided surface of the cage, and the sliding surface 6 may include a guiding surface of the inner or outer ring guiding the cage and made of oxide ceramic (such as $ZrO_2$), metal (such as SUJ2 or palladium), or the like.

When a tapered roller bearing is used as the sliding system 1, the slid surface 7 where the PLC film 9 is disposed may include an end surface of a flange, and the sliding surface 6 may include an outer circumferential surface of a roller. Alternatively, the slid surface 7 where the PLC film 9 is disposed may include the outer circumferential surface of the roller, and the sliding surface 6 may include the end surface of the flange, which is made of oxide ceramics (such as $ZrO_2$) or metal (such as SUJ2 or palladium).

When a bearing with separators is used as the sliding system 1, the slid surface 7 where the PLC film 9 is disposed may include the separators, and the sliding surface 6 may include external surfaces of balls, which are made of oxide ceramics (such as $ZrO_2$) or metal (such as SUJ2 or palladium).

When a slide bearing is used as the sliding system 1, the slid surface 7 where the PLC film 9 is disposed may include an inner circumferential surface of the slide bearing, and the sliding surface 6 may include an outer circumferential surface of a shaft, which is made of oxide ceramics (such as $ZrO_2$) or metal (such as SUJ2 or palladium).

When a seal is used as the sliding system 1, the slid surface 7 where the PLC film 9 is disposed may include an outer circumferential surface of a shaft, and the sliding surface 6 may include a seal surface of the seal, which is made of oxide ceramics (such as $ZrO_2$) or metal (such as SUJ2 or palladium).

When scissors are used as the sliding system 1, the slid surface 7 where the PLC film 9 is disposed may include a blade surface of one of blades, and the sliding surface 6 may include a blade surface of the other blade, which is made of oxide ceramics (such as $ZrO_2$) or metal (such as SUJ2 or palladium).

When a plunger pump is used as the sliding system 1, the slid surface 7 where the PLC film 9 is disposed may include an external surface of a piston (plunger), and the sliding surface 6 may include a fixed cam plate, which is made of oxide ceramics (such as $ZrO_2$) or metal (such as SUJ2 or palladium).

When an artificial joint is used as the sliding system 1, the slid surface 7 where the PLC film 9 is disposed may include a reception-side contact surface, and the sliding surface 6 may include a bone-side contact surface, which is made of oxide ceramics (such as $ZrO_2$) or metal (such as SUJ2 or palladium).

In the sliding system 1 described above, the sliding surface 6 is provided in one member, and the slid surface 7 is provided in the other member. However, the sliding surface 6 may be provided in the other member, and the slid surface 7 may be provided in the one member.

Figure 2:
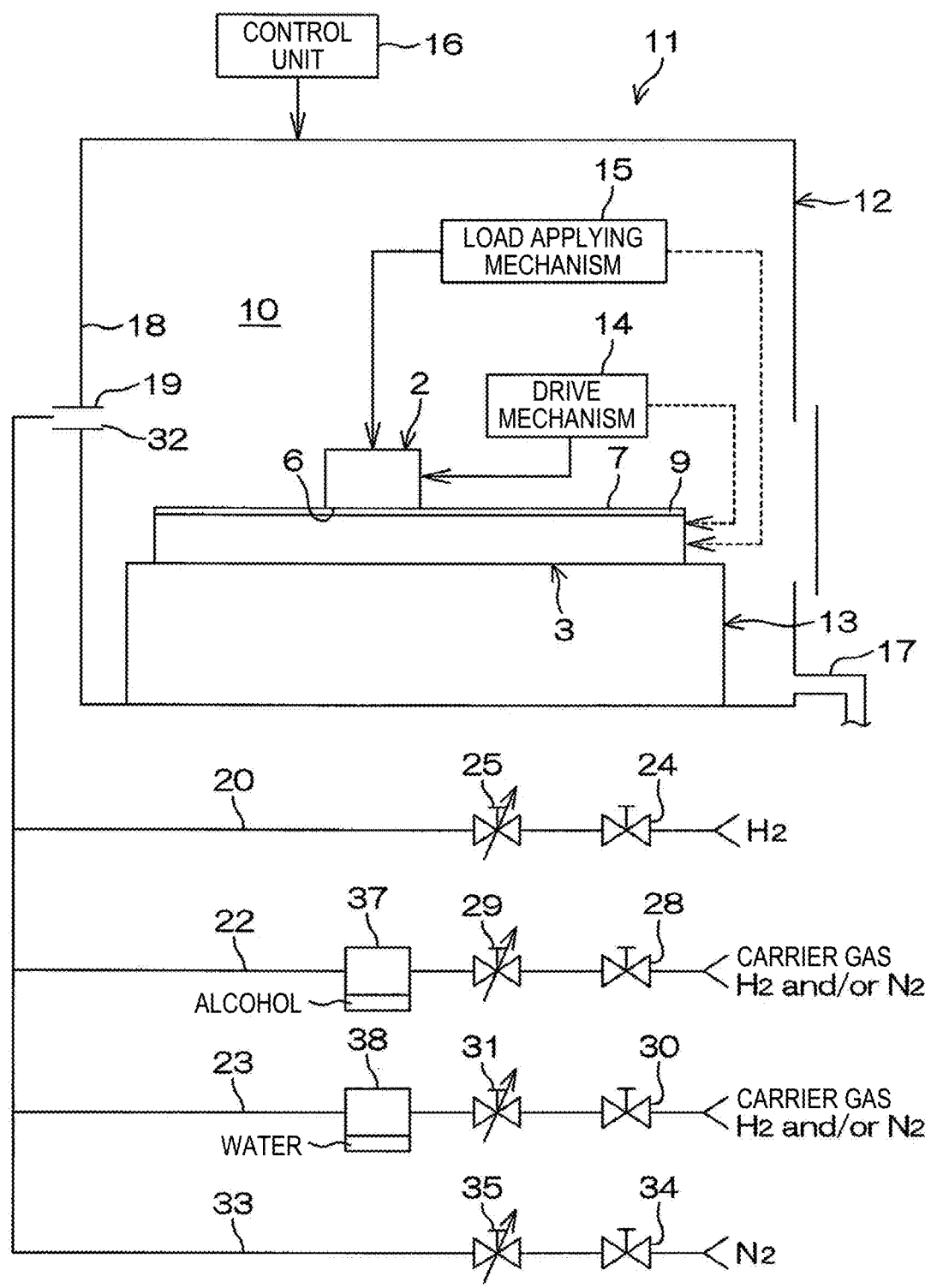
FIG. 2 is a schematic diagram showing a configuration of a film production apparatus in which the low-friction coating production method according to the embodiment of the invention is carried out.

FIG. 2 is a schematic diagram showing a configuration of a film production apparatus 11 in which the low-friction coating production method according to the embodiment of the invention is carried out. The film production apparatus 11 has a box-like chamber 12 including an internal space. The sliding member 2 and the slid member 3 are received in the internal space (space) 10 of the chamber 12. The film production apparatus 11 further includes a holding base 13 provided in the internal space 10 of the chamber 12. In FIG. 2, the holding base 13 is a holding base for holding the slid member 3, and the holding base 13 is fixedly disposed in the internal space 10 of the chamber 12. The slid member 3 carried in the internal space 10 of the chamber 12 is mounted on the holding base 13, and held by the holding base 3. The sliding member 2 is mounted on the slid member 3.

In order to slide the sliding surface 6 of the sliding member 2 relatively to the slid surface 7 of the slid member 3, the film production apparatus 11 includes a drive mechanism 14 for driving (moving) the sliding member 2, and a load applying mechanism 15 for applying a pressing load to the sliding member 2 so as to press the sliding member 2 against the slid member 3. The drive mechanism 14 is, for example, a mechanism including a motor. In addition, the film production apparatus 11 includes a control unit 16 for controlling operation of each device provided in the film production apparatus 11 and opening/closing of each valve provided in the film production apparatus 11. The drive mechanism 14 is, for example, a direct motion device arranged by a combination of a motor and a ball screw. The load applying mechanism 15 is, for example, a weight.

An exhaust duct 17 for leading out gas from the internal space 10 of the chamber 12 is provided in a bottom portion of the chamber 12. Although FIG. 2 shows a configuration in which the exhaust duct 17 is provided in the bottom portion of the chamber 12, the exhaust duct 17 may be provided in another position than the bottom portion in the chamber 12.

Although description has been made in FIG. 2 on the assumption that the drive mechanism 14 and the load applying mechanism 15 are provided, the drive mechanism 14 and the load applying mechanism 15 do not have to be provided as long as the sliding member 2 and the slid member 3 are configured to slide against each other in a state where a load is applied between the sliding member 2 and the slid member 3.

In addition, a treatment gas introduction pipe 19 is provided to penetrate a wall (for example, a side wall 18) of the chamber 12. A hydrogen gas pipe 20, an alcohol pipe 22, a water pipe 23, and a nitrogen gas pipe 33 are connected to the treatment gas introduction pipe 19. To the hydrogen gas pipe 20, hydrogen gas ($H_2$) is supplied from a hydrogen gas supply source. To the alcohol pipe 22, alcohol as an example of a hydrocarbon based substance is supplied from an alcohol vessel 37. To the water pipe 23, water is supplied from a water vessel 38. To the nitrogen gas pipe 33, nitrogen gas ($N_2$) is supplied from a nitrogen gas supply source. A hydrogen gas valve 24 for opening/closing the hydrogen gas pipe 20 and a hydrogen gas flow rate regulating valve 25 for changing the opening degree of the hydrogen gas pipe 20 are placed in the hydrogen gas pipe 20. An alcohol valve 28 for opening/closing the alcohol pipe 22 and an alcohol flow rate regulating valve 29 for changing the opening degree of the alcohol pipe 22 are placed in the alcohol pipe 22. A water valve 30 for opening/closing the water pipe 23 and a water flow rate regulating valve 31 for changing the opening degree of the water pipe 23 are placed in the water pipe 23. A nitrogen gas valve 34 for opening/closing the nitrogen gas pipe 33 and a nitrogen gas flow rate regulating valve 35 for changing the opening degree of the nitrogen gas pipe 33 are placed in the nitrogen gas pipe 33. Liquid alcohol, gaseous alcohol vaporized from the liquid alcohol, and carrier gas are present as alcohol in the alcohol vessel 37. The temperature of the alcohol vessel 37 is set at 20° C.±5° C. Gaseous alcohol supplied from the alcohol vessel 37 and carrier gas supplied from the outside flow into the alcohol pipe 22. Liquid water, gaseous steam vaporized from the liquid water, and carrier gas are present as water in the water vessel 38. The temperature of the water vessel 38 is set at 20° C.±5° C. Gaseous steam supplied from the water vessel 38 and carrier gas supplied from the outside flow into the water pipe 23.

The alcohol supplied into the treatment gas introduction pipe 19 includes at least one of methanol ($CH_3OH$), ethanol ($C_2H_5OH$), 1-propanol ($CH_3CH_2CH_2OH$), and 2-propanol ($CH_3CH(OH)CH_3$).

When the hydrogen gas valve 24 is opened in a state where the hydrogen gas pipe 20 has been set to have a large opening degree, a large flow rate of hydrogen is supplied from the hydrogen gas pipe 20 to the treatment gas introduction pipe 19. When the alcohol valve 28 and/or the water valve 30 are opened on this occasion, a small flow rate of alcohol gas and hydrogen gas ($H_2$) as carrier gas supplied from the outside and/or a small flow rate of steam and hydrogen gas ($H_2$) as carrier gas supplied from the outside are supplied into the treatment gas introduction pipe 19, and sufficiently mixed (agitated) with the large flow rate of hydrogen gas ($H_2$) as they flow through the treatment gas introduction pipe 19. Due to this mixture, special hydrogen gas (gas containing hydrogen and alcohol (hydroxyl group containing compound) and/or water (hydroxyl group containing compound)) is generated. The alcohol and/or the water have been vaporized in the generated special hydrogen gas. The generated special hydrogen gas is introduced into the internal space 10 of the chamber 12 from an inlet port 32 formed at a front end of the treatment gas introduction pipe 19. Thus, a special hydrogen gas atmosphere is obtained as the atmosphere of the internal space 10. Incidentally, the special hydrogen gas atmosphere does not contain oxygen.

When the nitrogen gas valve 34 is opened in a state where the nitrogen gas pipe 33 has been set to have a large opening degree, a large flow rate of nitrogen is supplied from the nitrogen gas pipe 33 to the treatment gas introduction pipe 19. When the alcohol valve 28 and/or the water valve 30 are opened on this occasion, a small flow rate of alcohol gas and nitrogen gas ($N_2$) as carrier gas supplied from the outside and/or a small flow rate of steam and nitrogen gas ($N_2$) as carrier gas supplied from the outside are supplied into the treatment gas introduction pipe 19, and sufficiently mixed (agitated) with the large flow rate of nitrogen gas ($N_2$) as they flow through the treatment gas introduction pipe 19. Due to this mixture, special nitrogen gas (gas containing nitrogen and alcohol (hydroxyl group containing compound) and/or water (hydroxyl group containing compound)) is generated. The alcohol and/or the water have been vaporized in the generated special nitrogen gas. The generated special nitrogen gas is introduced into the internal space 10 of the chamber 12. Thus, a special nitrogen gas atmosphere is obtained as the atmosphere of the internal space 10. Incidentally, the special nitrogen gas atmosphere does not contain oxygen.

When the alcohol valve 28 and/or the water valve 30 are opened in a state where the hydrogen gas valve 24 and the nitrogen gas valve 34 have been opened, special nitrogen/hydrogen gas (gas containing nitrogen and hydrogen, and alcohol (hydroxyl group containing compound) and/or water (hydroxyl group containing compound)) is generated. The generated special nitrogen/hydrogen gas is introduced into the internal space 10 of the chamber 12. Thus, a special nitrogen/hydrogen gas atmosphere is obtained as the atmosphere of the internal space 10. Incidentally, the special nitrogen/hydrogen gas atmosphere does not contain oxygen.

Figure 3A:
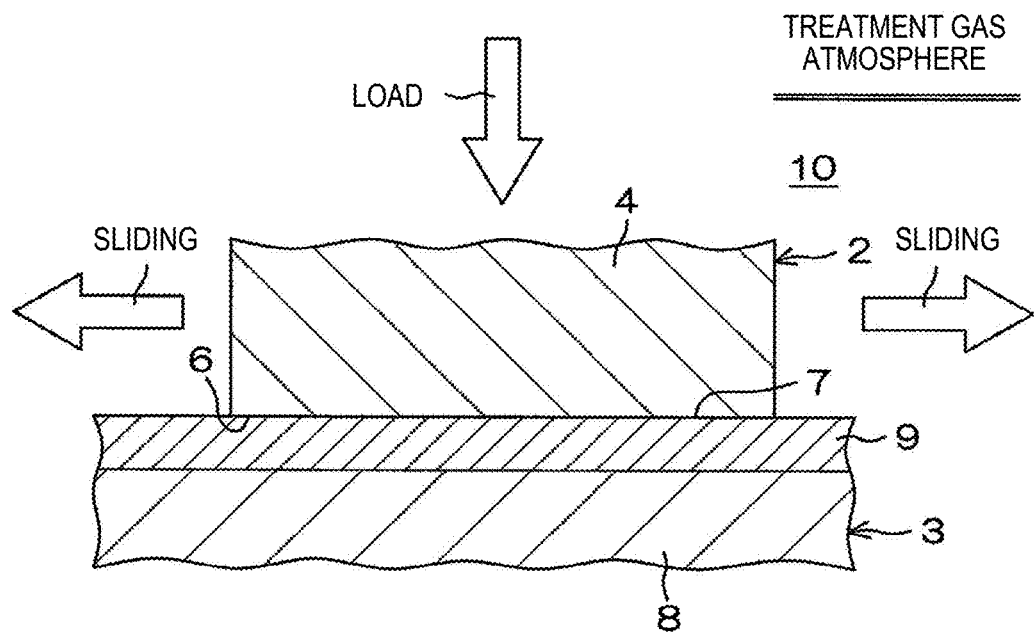
FIGS. 3A and 3B are sectional views showing a sliding operation between a sliding member and a slid member.
Figure 3B:
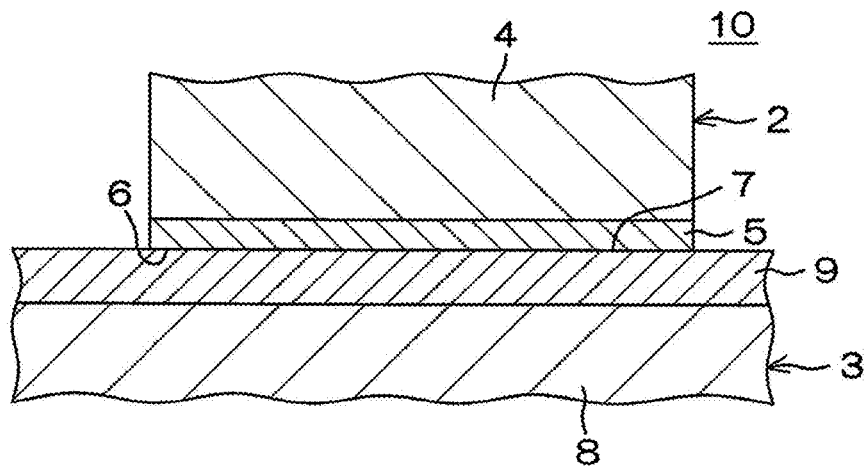

FIGS. 3A and 3B are sectional views showing a sliding operation between the sliding member 2 and the slid member 3. A production example in which the low-friction coating 5 is formed on the sliding surface 6 of the sliding member 2 by use of the film production apparatus 11 will be described below with reference to FIG. 2. FIGS. 3A and 3B will be referred to, as necessary.

In order to produce (form) the low-friction coating 5 by use of the film production apparatus 11, the sliding member 2 and the slid member 3 are carried into the internal space 10 of the chamber 12. The carried-in slid member 3 is mounted on the holding base 13 with the slid surface 7 upward. On the other hand, the carried-in sliding member 2 is mounted on the slid member 3 with the sliding surface 6 downward. Incidentally, the low-friction coating 5 is not formed on the sliding surface 6 of the sliding member 2 at the time when the sliding member 2 is carried into the internal space 10. That is, the sliding surface 6 is formed of oxide ceramics or metal.

After the sliding member 2 and the slid member 3 are carried into the internal space 10 of the chamber 12, the control unit 16 opens the hydrogen gas valve 24 and/or the nitrogen gas valve 34, and the alcohol valve 28 and/or the water valve 30 so as to supply treatment gas from the inlet port 32 of the treatment gas introduction pipe 19 to the internal space 10 of the chamber 12 (supply step). For example, assume that the treatment gas contains special hydrogen gas, and a very small amount of gaseous alcohol and a very small amount of gaseous steam are added to hydrogen gas in the special hydrogen gas. In addition to the hydrogen gas, the special hydrogen gas contains gaseous alcohol and gaseous steam, for example, at a volume ratio [alcohol/(alcohol+water)] of 4 to 44%. The volume ratio is a ratio of a flow rate of carrier gas including the gaseous alcohol in the alcohol vessel 37 to a total value of the flow rate of the carrier gas including the gaseous alcohol in the alcohol vessel 37 and a flow rate of carrier gas including the gaseous water in the water vessel 38.

The treatment gas supplied into the chamber 12 spreads all over the internal space 10 of the chamber 12. Thus, the atmosphere (air) in the internal space 10 of the chamber 12 is substituted to an atmosphere containing the treatment gas (substitution step). Incidentally, oxygen is not contained in the treatment gas.

After the internal space 10 of the chamber 12 is filled with the atmosphere of the treatment gas (in the state where the atmosphere of the treatment gas has been obtained in the internal space 10), the control unit 16 allowing the treatment gas to be continuously supplied controls the drive mechanism 14 to start sliding (sliding step) of the sliding surface 6 (sliding member 2) against the slid surface 7 (slid member 3) while applying a pressing load from the sliding surface 6 to the slid surface 7, as shown in FIG. 3A. Heltzian contact stress generated between the sliding surface 6 and the slid surface 7 during the sliding due to the applied pressing load is not smaller than 1.0 GPa. More preferably, the Heltzian contact stress is 1.3 Ga to 2.4 GPa.

When a predetermined period (for example, 30 minutes) has passed since the start of the sliding of the sliding surface 6, the control unit 16 closes the alcohol valve 28 and the water valve 30 to stop supplying the alcohol and the water to the internal space 10 (supply stop step).

With the sliding surface 6 sliding against the slid surface 7, due to the catalytic effect of the sliding surface 6 ($ZrO_2$ or the like), the low-friction coating 5 is formed on the sliding surface 6 as a result of the sliding of the sliding surface 6 against the slid surface 7. The low-friction coating 5 shows an extremely low friction coefficient of $10^{-4}$ order (lower than 0.001). Due to the low-friction coating 5 provided on the sliding surface 6 of the sliding member 2, a friction-fade-out state (hereinafter referred to as "FFO") showing a friction coefficient of $10^{-4}$ order can be generated. To say other words, as a result of the sliding of the sliding surface 6 against the slid surface 7, the friction coefficient decreases gradually in accordance with friction, so that FFO can be generated.

The low-friction coating 5 corresponds to FPF-2, which will be described later. The low-friction coating 5 is a transparent film having hardness equivalent to that of the PLL film 9 and showing interference fringes. Blisters (bubbles) are generated in the surface and inside of the low-friction coating 5.

The present inventor et. al regard a mechanism of forming the low-friction coating 5 (generating FFO) as follows.

That is, with the sliding (friction) of the sliding surface 6, the outermost surface of the PLC film 9 is made into abrasion powder due to the friction, and transferred to the sliding surface 6. That is, a transfer film transferred from the PLC film 9 is formed on the sliding surface 6. In accordance with the progress of sliding, the PLC film 9 and the transfer film rub against each other. Metal (such as SUJ2 or palladium) or oxide ceramics ($ZrO_2$) forming the sliding surface 6 has catalytic properties capable of dissociating and adsorbing hydrogen molecules to thereby generate active hydrogen. Therefore, due to the catalytic effect of the sliding surface 6, active hydrogen can be provided in the sliding interface as a result of the sliding of the sliding surface 6 against the PLC film 9.

The alcohol contained in the atmosphere of the internal space 10 is hydrocracked by the acid catalytic effect of the active hydrogen in the sliding surface 6 so that volatile gas can be formed on the transfer film. It is therefore considered that a gas molecular layer of the volatile gas is formed in the frictional surface (sliding interface) of the transfer film. The gas molecular layer has a thickness corresponding to several molecules. It is therefore considered that FFO can be generated due to single-molecular-level gas lubrication of the volatile gas. That is, the low-friction coating 5 is formed based on the transfer film including the volatile gas layer.

In addition, in the embodiment, when a predetermined period has passed since the start of the sliding of the sliding surface 6, supplying alcohol and water is stopped. Thus, moisture (water) can be eliminated from the atmosphere of the internal space 10. Moisture (water) can serve as poison in catalyst to weaken the catalytic effect of oxide ceramics ($ZrO_2$) or metal (SUJ or palladium). Thus, when moisture (water) is eliminated, the catalytic effect of the oxide ceramics or the metal can be stabilized.

The mechanism of generating FFO will be described below more specifically.

When the active hydrogen in the sliding surface 6 touches a $C_2H_x$ to $C_4H_x$ fragment of the PLC film 9 having a C=C bond, the active hydrogen catalytically reduces a π bond of a C=C bond portion to thereby generate two C—H bonds (cis-addition reaction) facing the sliding interface. Since the C=C bond high in planarity is made into a C—C bond (σ bond), a degree of freedom of deformation in the fragment increases so that a volatile gas layer can be formed in the friction interface.

In addition, a repulsive force (repulsive force to van der Waals force) between hydrogen atoms of the C—H bonds can be also regarded as a factor in the generation of FFO. Formation of a C—C bond fragment that can be vaporized easily by friction can be also regarded as a factor in the generation of FFO.

When a predetermined period has passed since the start of the sliding of the sliding surface 6, the control unit 16 closes the open valves (the hydrogen gas valve 24, the alcohol valve 28, the water valve 30, the nitrogen gas valve 34, etc.) to stop introducing the treatment gas from the treatment gas introduction pipe 19. After that, the control unit 16 carries out the sliding member 2 and the slid member 3 from the internal space 10 of the chamber 12.

When methanol is used as the alcohol, it is preferable that a ratio of a flow rate of carrier gas including gaseous methanol in the alcohol vessel 37 to a total of the flow rate of the carrier gas including the gaseous methanol in the alcohol vessel 37 and a flow rate of carrier gas including gaseous steam in the water vessel 38 is 6% to 15%. FFO can be generated even if the ratio of the flow rate of the carrier gas including the gaseous methanol in the alcohol vessel 37 to the total of the flow rate of the carrier gas including the gaseous methanol in the alcohol vessel 37 and the flow rate of the carrier gas including the gaseous steam in the water vessel 38 is another value (which may include 100%).

When ethanol is used as the alcohol, it is preferable that a ratio of a flow rate of carrier gas including gaseous ethanol in the alcohol vessel 37 to a total of the flow rate of the carrier gas including the gaseous ethanol in the alcohol vessel 37 and a flow rate of carrier gas including gaseous steam in the water vessel 38 is 6% to 30%. FFO can be generated even if the ratio of the flow rate of the carrier gas including the gaseous ethanol in the alcohol vessel 37 to the total of the flow rate of the carrier gas including the gaseous ethanol in the alcohol vessel 37 and the flow rate of the carrier gas including the gaseous steam in the water vessel 38 is another value (which may include 100%). However, FFO can be generated in a stable state and for a long time particularly when the ratio of the flow rate of the carrier gas including the gaseous ethanol in the alcohol vessel 37 to the total of the flow rate of the carrier gas including the gaseous ethanol in the alcohol vessel 37 and the flow rate of the carrier gas including the gaseous steam in the water vessel 38 is 15% to 25%.

Next, first to thirteenth friction tests performed by use of a first friction tester 41 will be described.

Figures 5A, 5B:
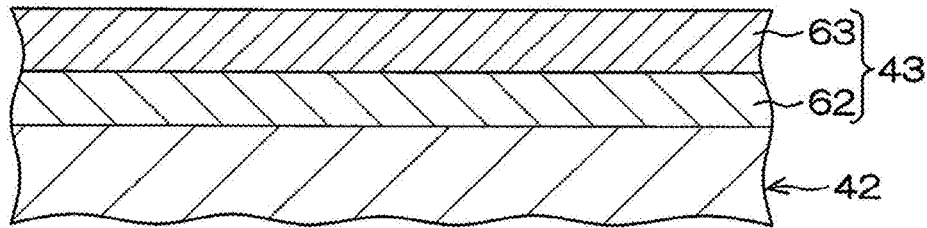
FIGS. 5A and 5B are a view and a table for explaining plate test pieces to be measured in first to thirteenth friction tests.

FIG. 4 is a schematic sectional view showing a configuration of the first friction tester 41. FIG. 5A is an enlarged sectional view showing a surface of each of plate test pieces 42 to be measured in the first to thirteenth friction tests. FIG. 5B is a table showing physical properties and a film production method of a two-layered film 43 formed in the surface of the place test piece 42.

A pin-on-plate type reciprocal sliding friction tester shown in FIG. 4 was used as the first friction tester 41. A $ZrO_2$ (YSZ) ball having a diameter of 4.8 mm and subjected to heat treatment at 200° C. in the atmosphere for 24 hours was used as a pin test piece 44 to be tested. A weight 71 was put on the pin test piece 44 to be tested, and the weight of the weight 71 was changed so that a load applied to the pin test piece 44 could be changed.

The first friction tester 41 is, for example, provided with a cylindrical chamber 45, and the pin test piece 44 is received in the chamber 45. The chamber 45 includes an acrylic chamber body 46 having a bottomed cylindrical shape, and an acrylic cover 47 closing the top of the chamber body 46. A long opening 48 long in a sliding direction of the pin test piece 44 is formed in the cover 47, and the pin test piece 44 is placed in the opening 48. A holding base 49 for holding the plate test piece 42 is disposed in a bottom portion of the chamber 45. A gas introduction pipe 51 is provided to penetrate a circumferential wall 50 of the chamber body 46. A first line 52 and a second line 53 are connected to the gas introduction pipe 51. Hydrogen gas is supplied through the first line 52, and hydrogen gas containing gaseous alcohol and gaseous steam is supplied through the second line 53. A first valve 54, a first flow rate regulating valve 55, and a first flowmeter 56 are placed in the first line 52. The first line 52 is opened/closed by the first valve 54. The flow rate of the hydrogen gas in the first line 52 is regulated by the first flow rate regulating valve 55. The flow rate of the hydrogen gas in the first line 52 is detected by the first flowmeter 56. A second valve 57, a second flow rate regulating valve 58, a second flowmeter 59, and an alcohol/water vessel 60 are placed in the second line 53. The second line 53 is opened/closed by the second valve 57. The flow rate of the hydrogen gas in the second line 53 is regulated by the second flow rate regulating valve 58. The flow rate of the hydrogen gas in the second line 53 is detected by the second flowmeter 59. Alcohol and water are stored in the alcohol/water vessel 60. The temperature of the alcohol/water vessel 60 is set at 20° C.±5° C. In the alcohol/water vessel 60, alcohol and water exist as a solution of liquid alcohol and water, and gaseous alcohol and gaseous steam vaporized from the solution. When the second valve 57 is opened, hydrogen gas flows through the second line 53, and the hydrogen gas is supplied to the alcohol/water vessel 60. When the hydrogen gas circulates inside the alcohol/water vessel 60 where alcohol and water are stored, gaseous alcohol and gaseous steam are conveyed by the hydrogen gas to thereby reach the gas introduction pipe 51. Then, when the second valve 57 is opened and the first valve 54 is opened, the hydrogen gas containing the gaseous alcohol and the gaseous steam is supplied into the chamber 45 through the gas introduction pipe 51. The chamber 45 is provided so that the atmosphere in the chamber 45 can be controlled.

As shown in FIG. 5A, a silicon substrate 61 having the two-layered film 43 formed in its surface was used in the plate test piece 42. The two-layered film 43 was a hard carbon based film having a two-layered structure. An Si-DLC film 62 was on the lower layer side of the two-layered film 43. An PLC (Polymer-Like-Carbon) film 63 was on the upper layer side of the two-layered film 43. The Si-DLC film 62 was formed by an ionization vapor deposition method (PVD method) using raw material gas in which toluene and trimethylsilane ($Si(CH_3)_4$) were mixed at a gas flow rate of 2:3. The PLC film 63 was formed by an ionization vapor deposition method using only toluene as raw material gas. A bias voltage for forming the PLC film was set at −0.4 kV (low bias voltage).

FIG. 5B shows deposition pressure (Pa) during film formation, bias voltage (kV) during the film formation, treatment temperature (K) during the film formation, film thickness (nm), fine indentation hardness (GPa), Young's modulus (GPa), G-peak position ($cm^{-1}$) in a Raman spectrum, G-peak half value width (FWHM(G), $cm^{-1}$) in the Raman spectrum, intensity ratio (I(D)/I(G)) between D-peak and G-peak in the Raman spectrum, and estimated hydrogen concentration (at. %) in each of the Si-DLC film 62 and the PLC film 63.

The plate test piece 42 was set in the first friction tester 41 so that the surface where the two-layered film 43 was formed could be used as a surface to be tested. The following first to thirteenth friction tests (high load tests repeated up to 28,200 times) were performed to investigate a generation state of FFO while increasing the magnitude of a load applied to the surface of the plate test piece 42 through the pin test piece 44 stepwise by units of 1.96 N within a range of from 19.6 N to 58.8 N under test conditions that the frictional speed was 8.0 mm/s, the frictional stroke was 4.0 mm, the flow rate of gas supplied to the chamber 45 was about 2.0 to 6.2 (liters/minute), and lubrication was absent.

First, description will be made about the first to fourth friction tests. The temperature inside the chamber 45 was set at 20° C.±5° C. In the first to fourth friction tests, methanol was used as alcohol, and concentration of methanol contained in treatment gas (special hydrogen gas containing alcohol and water in this case. The same thing can be also applied to the following cases) was changed.

In the first to fourth friction tests, the gas flow rate in the first line 52 was set at 8 (liters/minute), and the gas flow rate in the second line 53 was set at 200 sccm. Hydrogen gas was made to flow through the first line 52. Hydrogen gas was made to flow through the second line 53 as carrier gas.

In addition, in the first to fourth friction tests, a float type flowmeter was used as the second flowmeter 59 for detecting the gas flow rate in the second line 53. The lower detection limit of the second flowmeter 59 was 200 sccm. Therefore, the gas flow rate in the second line 53 feedback-controlled based on the second flowmeter 59 could not be controlled to a fixed flow rate. Thus, in each of the first to fourth friction tests, assume that the gas flow rate in the second line 53 decreased gradually after the start of the test.

<First Friction Test>

Water of 20 cc and methanol of 1 cc were put into the alcohol/water vessel 60. That is, the special hydrogen gas supplied to the chamber 45 contained gaseous methanol and gaseous steam generated from a solution in which vol % concentration of liquid methanol to the liquid methanol and liquid water was 4.8%.

<Second Friction Test>

Water of 10 cc and methanol of 1 cc were put into the alcohol/water vessel 60. That is, the special hydrogen gas supplied to the chamber 45 contained gaseous methanol and gaseous steam generated from a solution in which vol % concentration of liquid methanol to the liquid methanol and liquid water was 9.1%.

<Third Friction Test>

Water of 10 cc and methanol of 2 cc were put into the alcohol/water vessel 60. That is, the special hydrogen gas supplied to the chamber 45 contained gaseous methanol and gaseous steam generated from a solution in which vol % concentration of liquid methanol to the liquid methanol and liquid water was 16.7%.

<Fourth Friction Test>

Water of 10 cc and methanol of 10 cc were put into the alcohol/water vessel 60. That is, the special hydrogen gas supplied to the chamber 45 contained gaseous methanol and gaseous steam generated from a solution in which vol % concentration of liquid methanol to the liquid methanol and liquid water was 50%.

Figure 6:
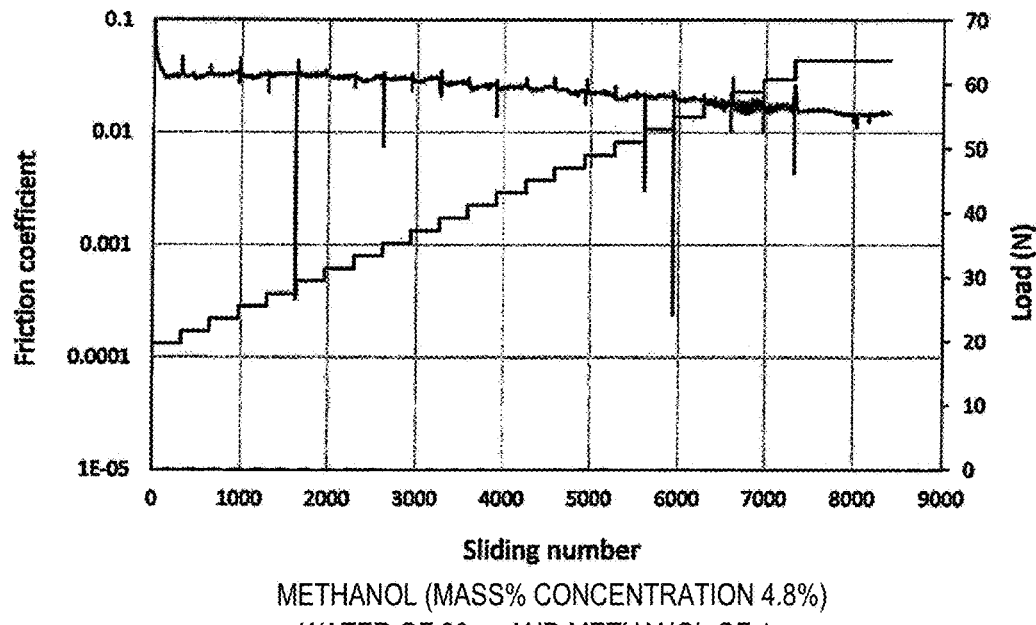
FIG. 6 is a graph showing a relation between an applied load and a measured value of a friction coefficient in the first friction test.

FIGS. 6 to 9 are graphs showing a relation between an applied load and a measured value of a friction coefficient in the first to fourth friction tests. In the first friction test, as shown in FIG. 6, the friction coefficient was not lower than 0.01, and FFO (Friction-Fade-Out state) was not generated in any applied load conditions.

Figure 7:
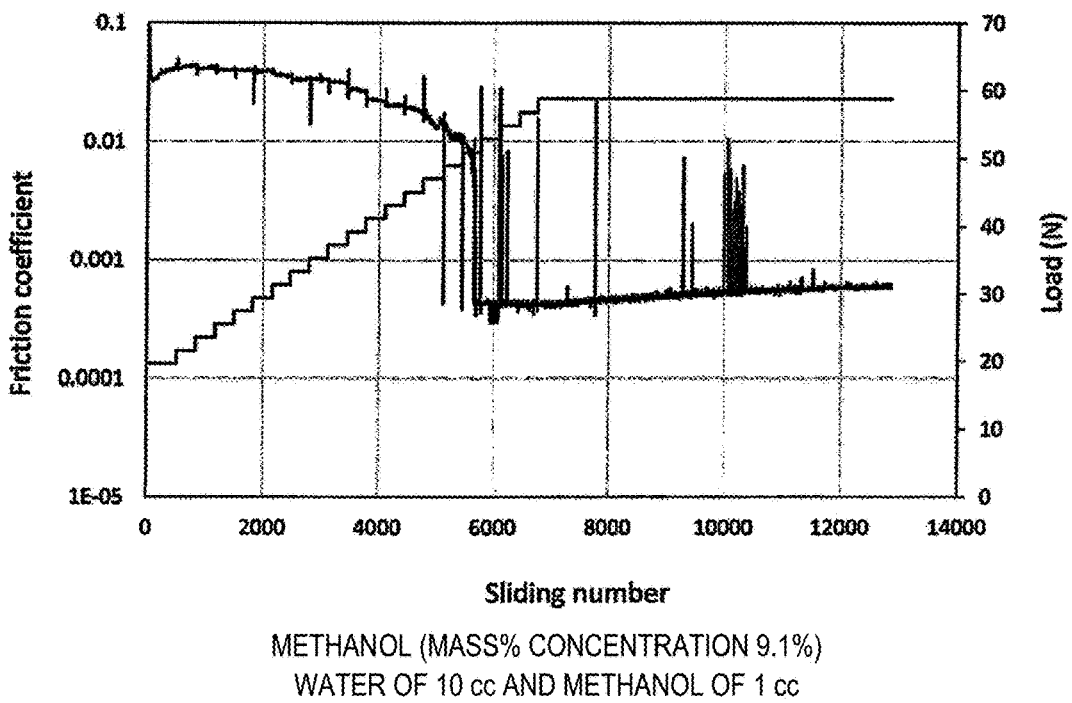
FIG. 7 is a graph showing a relation between an applied load and a measured value of a friction coefficient in the second friction test.

In the second friction test, as shown in FIG. 7, as soon as the load reached about 50 N, the friction coefficient dropped down suddenly, and FFO was generated. The friction coefficient at the time when FFO was generated was $5 \times 10^{-4}$ to $7 \times 10^{-4}$. After that, even when the load was increased, the FFO was generated continuously. Even when the load reached 58.8 N and the high load was kept constant, the FFO was generated continuously and stably. After the FFO had been continuously generated for 70 minutes, the second friction test was terminated.

Figure 8:
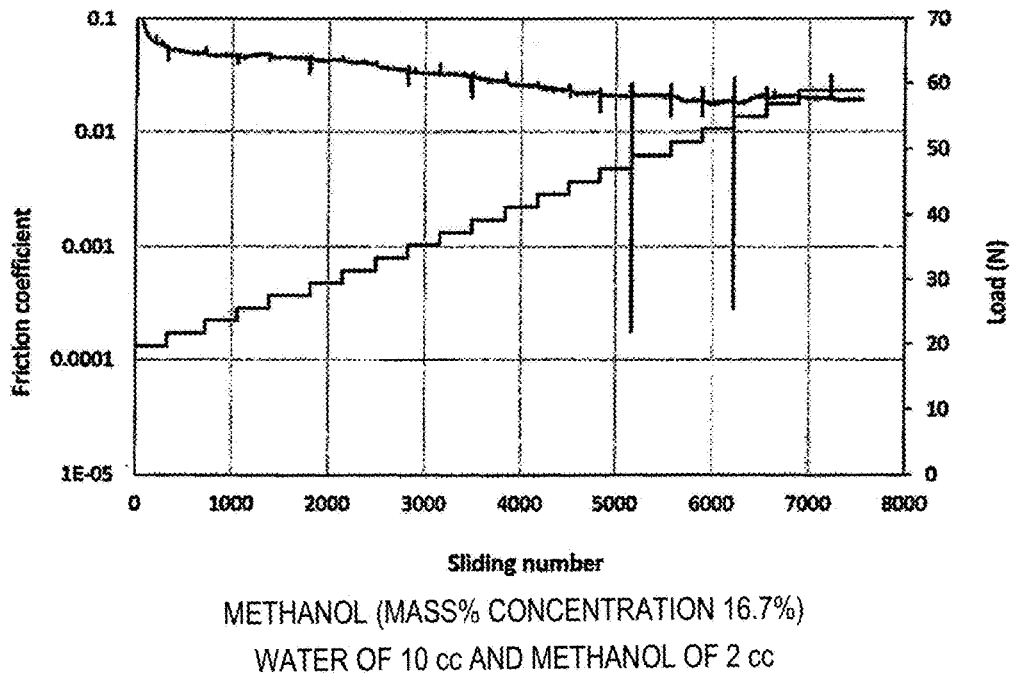
FIG. 8 is a graph showing a relation between an applied load and a measured value of a friction coefficient in the third friction test.

In the third friction test, as shown in FIG. 8, the friction coefficient was not lower than 0.01, and FFO was not generated in any applied load conditions.

Figure 9:
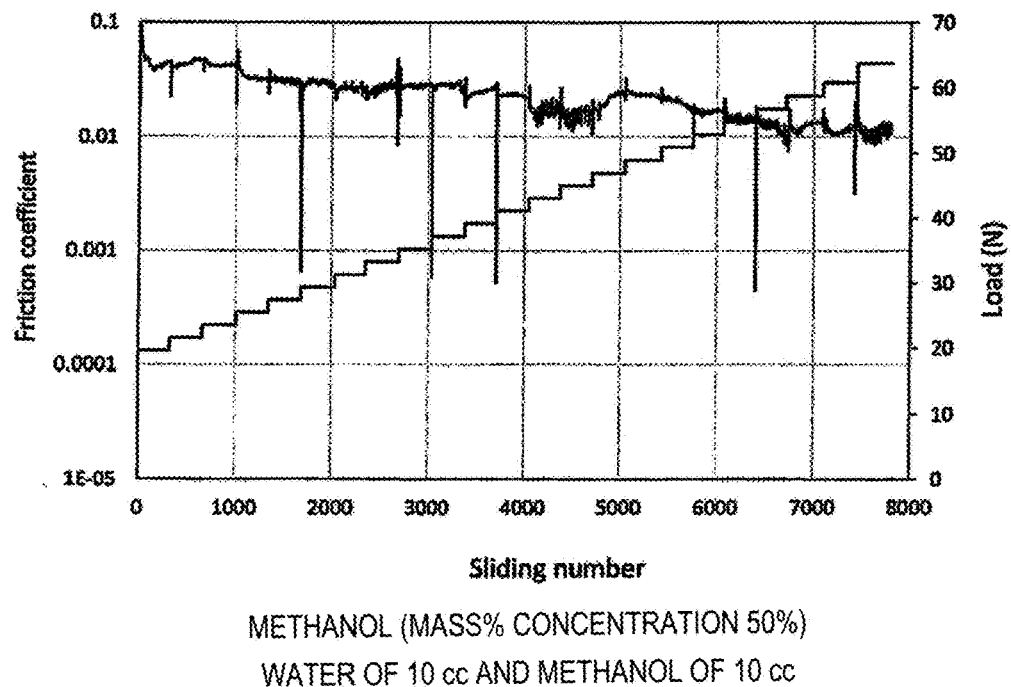
FIG. 9 is a graph showing a relation between an applied load and a measured value of a friction coefficient in the fourth friction test.

In the fourth friction test, as shown in FIG. 9, the friction coefficient was not lower than 0.01, and FFO was not generated in any applied load conditions.

From the first to fourth friction tests, in the case where methanol is used as alcohol, it is understood that FFO is easily generated when the special hydrogen gas containing alcohol and water contains gaseous methanol and gaseous steam generated from a solution in which vol % concentration of liquid methanol to the liquid methanol and liquid water is 6 to 15%, and particularly FFO is easily generated when the vol % concentration of the liquid methanol to the liquid methanol and the liquid water is about 9%.

Next, description will be made about the fifth to ninth friction tests. The temperature inside the chamber 45 was set at 20° C.±5° C. In the fifth to ninth friction tests, ethanol was used as alcohol, and concentration of ethanol contained in special hydrogen gas was changed.

In the fifth to ninth friction tests, the gas flow rate in the first line 52 was set at 8 (liters/minute), and the gas flow rate in the second line 53 was set at 200 sccm.

In addition, in the fifth to ninth friction tests, a float type flowmeter was used as the second flowmeter 59 for detecting the gas flow rate in the second line 53. The lower detection limit of the second flowmeter 59 was 200 sccm. Therefore, the gas flow rate in the second line 53 feedback-controlled based on the second flowmeter 59 could not be controlled to a fixed flow rate. Thus, in each of the fifth to ninth friction tests, assume that the gas flow rate in the second line 53 decreased gradually after the start of the test.

<Fifth Friction Test>

Water of 10 cc and methanol of 1 cc were put into the alcohol/water vessel 60. That is, the special hydrogen gas supplied to the chamber 45 contained gaseous ethanol and gaseous steam generated from a solution in which vol % concentration of liquid ethanol to the liquid ethanol and liquid water was 9.1%.

<Sixth Friction Test>

Water of 10 cc and ethanol of 2 cc were put into the alcohol/water vessel 60. That is, the special hydrogen gas supplied to the chamber 45 contained gaseous ethanol and gaseous steam generated from a solution in which vol % concentration of liquid ethanol to the liquid ethanol and liquid water was 16.7%.

<Seventh Friction Test>

Water of 10 cc and ethanol of 3 cc were put into the alcohol/water vessel 60. That is, the special hydrogen gas supplied to the chamber 45 contained gaseous ethanol and gaseous steam generated from a solution in which vol % concentration of liquid ethanol to the liquid ethanol and liquid water was 23.1%.

<Eighth Friction Test>

Water of 10 cc and ethanol of 5 cc were put into the alcohol/water vessel 60. That is, the special hydrogen gas supplied to the chamber 45 contained gaseous ethanol and gaseous steam generated from a solution in which vol % concentration of liquid ethanol to the liquid ethanol and liquid water was 33.3%.

<Ninth Friction Test>

Water of 10 cc and ethanol of 10 cc were put into the alcohol/water vessel 60. That is, the special hydrogen gas supplied to the chamber 45 contained gaseous ethanol and gaseous steam generated from a solution in which vol % concentration of liquid ethanol to the liquid ethanol and liquid water was 50%.

FIGS. 10 to 14 are graphs showing a relation between an applied load and a measured value of a friction coefficient in the fifth to ninth friction tests.

Figure 10:
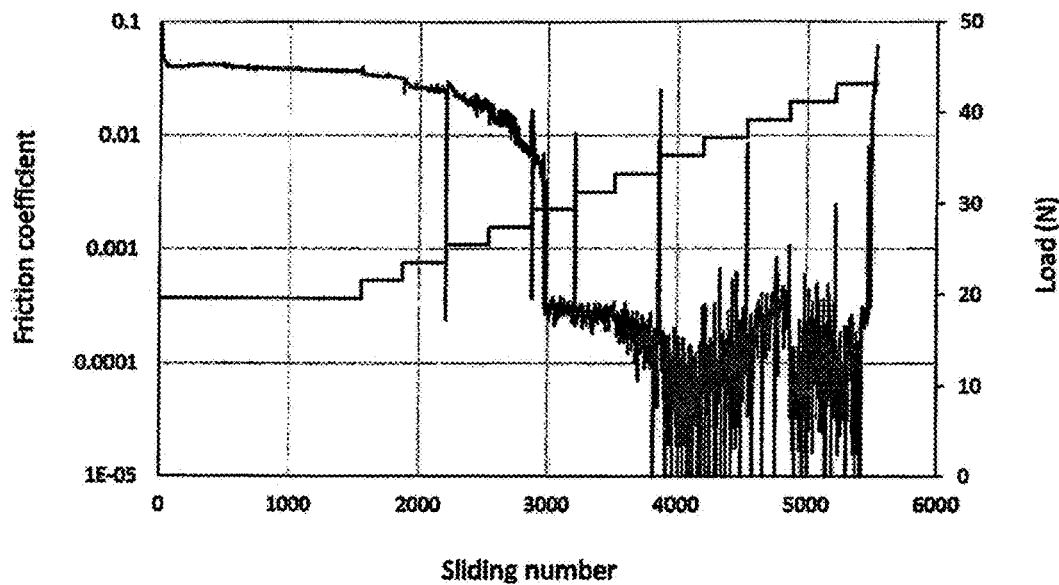
FIG. 10 is a graph showing a relation between an applied load and a measured value of a friction coefficient in the fifth friction test.

In the fifth friction test, as shown in FIG. 10, as soon as the load reached about 27 N, the friction coefficient dropped down suddenly, and FFO was generated. The friction coefficient at the time when FFO was generated was about $5 \times 10^{-4}$. After that, as the load was increased, the friction coefficient decreased gently. As soon as the friction coefficient reached $10^{-5}$ order, the friction coefficient repeated sudden increase and decrease between $10^{-4}$ order and $10^{-5}$ order. When the load reached 42 N, the friction coefficient increased to about $8 \times 10^{-2}$, and the fifth friction test was terminated.

Figure 11:
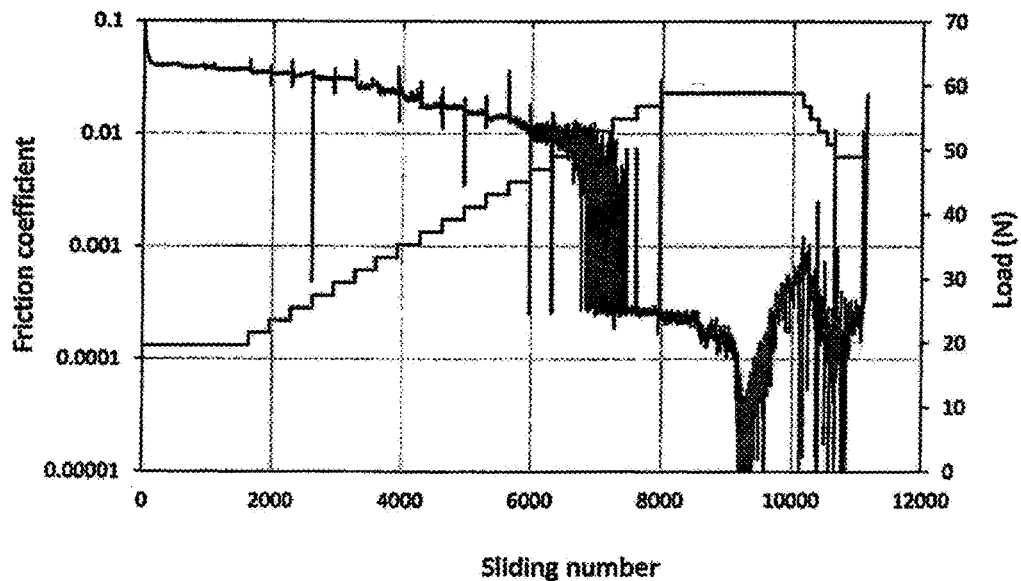
FIG. 11 is a graph showing a relation between an applied load and a measured value of a friction coefficient in the sixth friction test.

In the sixth friction test, as shown in FIG. 11, as soon as the load reached about 50 N, the friction coefficient dropped down suddenly, and FFO was generated. After that, even when the load was increased, the FFO was continuously generated and kept. When the high load was kept constant after the load reached 58.8 N, the friction coefficient dropped down to $10^{-5}$ order. After that, since an unstable state that the friction coefficient increased gently was observed, the load was decreased stepwise. However, the instability in friction coefficient could not be canceled. After that, the friction coefficient increased to 0.02, and the sixth friction test was terminated.

Figure 12:
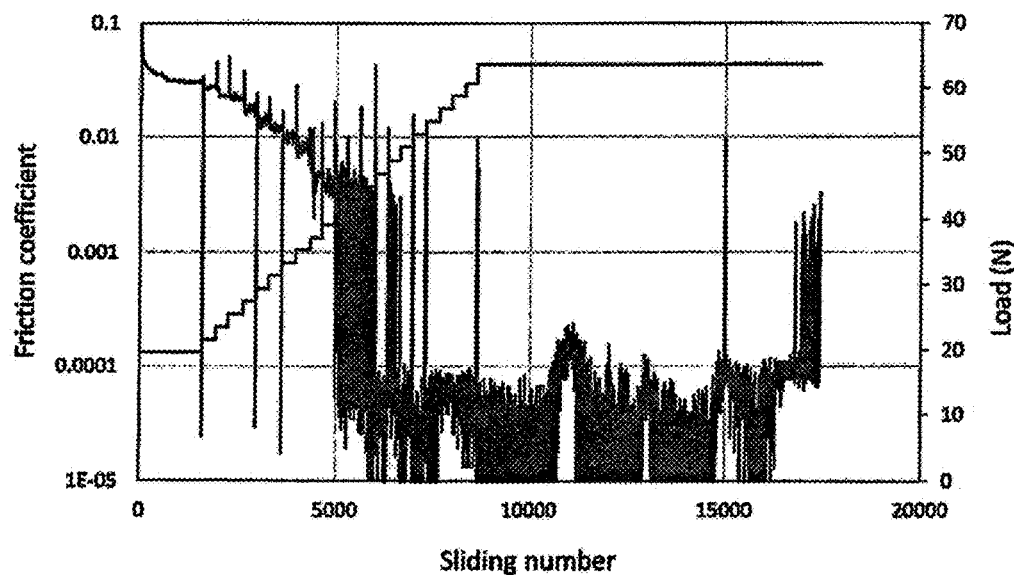
FIG. 12 is a graph showing a relation between an applied load and a measured value of a friction coefficient in the seventh friction test.

In the seventh friction test, as shown in FIG. 12, as soon as the load reached about 40 N, the friction coefficient dropped down suddenly, and FFO was generated. After that, the friction coefficient repeated large increase and decrease between $10^{-3}$ order and $10^{-5}$ order. When the load reached about 50 N, the large increase and decrease disappeared, and the friction coefficient was stabilized in $10^{-5}$ order. When a high load was kept constant after the load reached 58.8 N, the friction coefficient was kept stable in $10^{-5}$ order. That is, in the seven friction test, the friction coefficient during the generation of FFO had an extremely small value.

When 25 minutes had passed since the load reached 58.8 N, the friction coefficient increased to $10^{-4}$ order. Therefore, the amount of hydrogen gas containing ethanol and water was increased. Thus, the friction coefficient dropped down to $10^{-5}$ order again.

As for this increase in friction coefficient, it is considered that the low-friction coating (equivalent to the low-friction coating 5 in FIG. 1) formed in the sliding surface 6 (see FIG. 1 and so on) was separated due to sliding, and it is estimated that ethanol and water were exhausted in the sliding surface 6 (sliding interface) so that the low-friction coating 5 could not be regenerated in the sliding surface 6. It is considered that when the supply rate of ethanol and water was increased, regenerating the low-friction coating 5 in the sliding surface 6 was promoted, and the friction coefficient dropped down to $10^{-5}$ order again.

After 90 minutes had passed since the load reached 58.8 N, the friction coefficient increased suddenly, and the seventh friction test was terminated.

Figure 13:
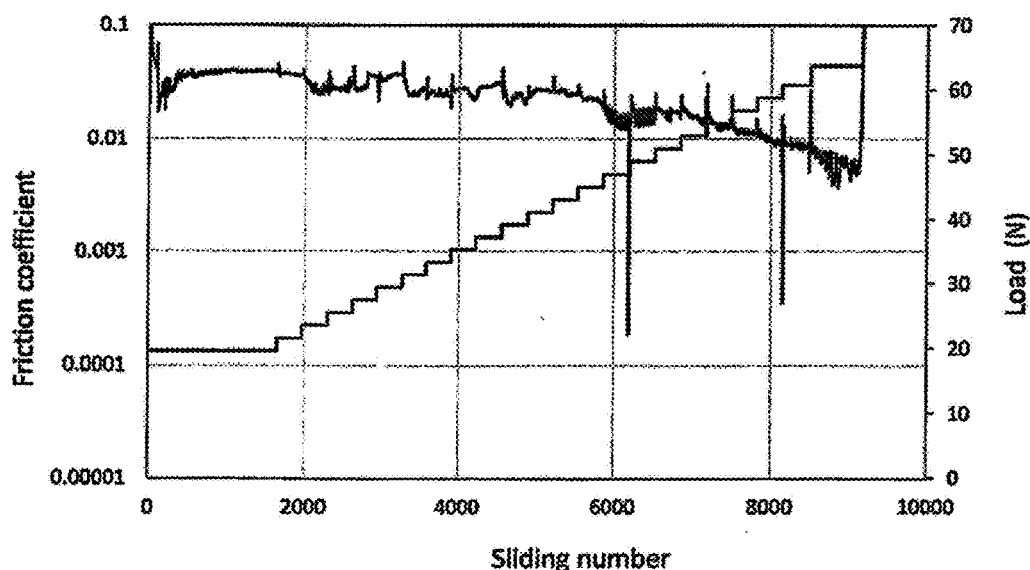
FIG. 13 is a graph showing a relation between an applied load and a measured value of a friction coefficient in the eighth friction test.

In the eighth friction test, as shown in FIG. 13, the friction coefficient was not lower than 0.01, and FFO was not generated in any applied load conditions.

Figure 14:
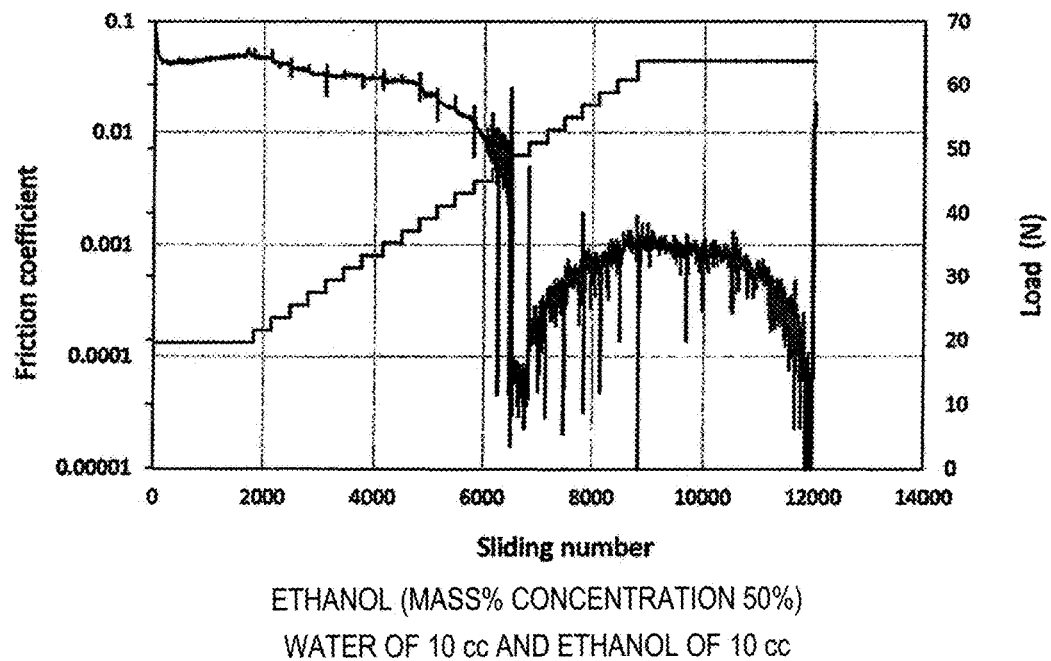
FIG. 14 is a graph showing a relation between an applied load and a measured value of a friction coefficient in the ninth friction test.

In the ninth friction test, as shown in FIG. 14, as soon as the load reached about 45 N, the friction coefficient decreased suddenly, and FFO was generated. At the time when FFO was generated, the friction coefficient was low to be about $1 \times 10^{-4}$. As the load increased, the friction coefficient increased, and reached to $10^{-3}$ order. After the load reached 58.8 N, the high load was kept constant. As a result, the friction coefficient dropped down, and FFO was generated again. After that the friction coefficient increased suddenly, and the ninth friction test was terminated.

From the fifth to ninth friction tests, in the case where ethanol is used as alcohol, it is understood that FFO is easily generated when the special hydrogen gas contains gaseous ethanol and gaseous steam generated from a solution in which vol % concentration of liquid ethanol to the liquid ethanol and liquid water is about 6 to about 30%, and particularly FFO is easily generated when the special hydrogen gas contains gaseous ethanol and gaseous steam generated from a solution in which the vol % concentration of the liquid ethanol to the liquid ethanol and the liquid water is about 15 to about 25%. It is also understood that load resistance can be obtained when the concentration is within this range.

In addition, from the seventh friction test, it is understood that in order to generate FFO, it is necessary to supply "ethanol and water" to the sliding surface 6 and the slid surface 7. Accordingly, in order to keep the generated FFO, it is understood that it is necessary to always continuously supply alcohol and water to the sliding surface 6 and the slid surface 7.

Next, description will be made about the tenth to thirteenth friction tests. The temperature inside the chamber 45 was set at 20° C.±5° C. Methanol, ethanol, 1-propanol and 2-propanol were set as the kind of alcohol contained in special hydrogen gas in the tenth to thirteenth friction tests respectively.

In addition, in the tenth to thirteenth friction tests, a mass flowmeter (TM39 made by Fujikin Incorporated) was used as the second flowmeter 59 for detecting the gas flow rate in the second line 53.

In the tenth to thirteenth friction tests, during a period (run-in step) between the start of each test and a friction number of 500 times, the gas flow rate in the first line 52 was set at 6 (liters/minute), and the gas flow rate in the second line 53 was set at 200 sccm. During a period from the termination of the friction number of 500 times to the end of the test, the gas flow rate in the first line 52 was kept at 6 (liters/minute), and the gas flow rate in the second line 53 was set at 100 sccm. On this occasion, between before and after the friction number of 500 times, there was no change in vol % concentration of liquid alcohol to the liquid alcohol and liquid water in a solution from which gaseous alcohol and gaseous steam contained in special hydrogen gas were generated.

<Tenth Friction Test>

Water of 10 cc and methanol of 3 cc were put into the alcohol/water vessel 60. That is, the special hydrogen gas supplied to the chamber 45 contained gaseous methanol and gaseous steam generated from a solution in which vol % concentration of liquid methanol to the liquid methanol and liquid water was 23.1%.

<Eleventh Friction Test>

Water of 10 cc and ethanol of 3 cc were put into the alcohol/water vessel 60. That is, the special hydrogen gas supplied to the chamber 45 contained gaseous ethanol and gaseous steam generated from a solution in which vol % concentration of liquid ethanol to the liquid ethanol and liquid water was 23.1%.

<Twelfth Friction Test>

Water of 10 cc and 1-propanol of 3 cc were put into the alcohol/water vessel 60. That is, the special hydrogen gas supplied to the chamber 45 contained gaseous 1-propanol and gaseous steam generated from a solution in which vol % concentration of liquid 1-propanol to the liquid 1-propanol and liquid water was 23.1%.

<Thirteenth Friction Test>

Water of 10 cc and 2-propanol of 3 cc were put into the alcohol/water vessel 60. That is, the special hydrogen gas supplied to the chamber 45 contained gaseous 2-propanol and gaseous steam generated from a solution in which vol % concentration of liquid 2-propanol to the liquid 2-propanol and liquid water was 23.1%.

FIGS. 15 to 18 are graphs showing a relation between an applied load and a measured value of a friction coefficient in the tenth to thirteenth friction tests.

Figure 15:
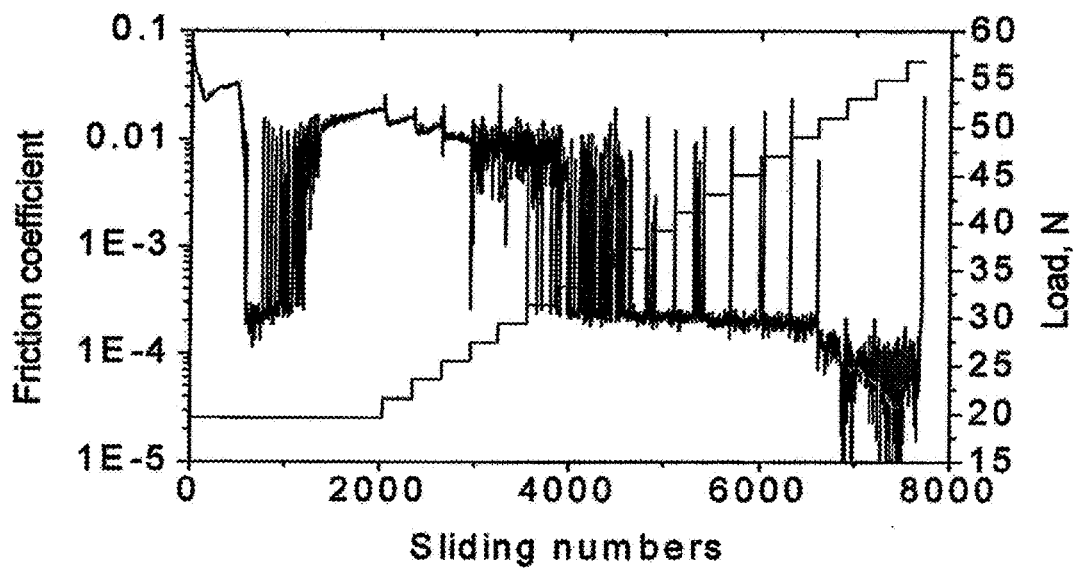
FIG. 15 is a graph showing a relation between an applied load and a measured value of a friction coefficient in the tenth friction test.

In the tenth friction test, as shown in FIG. 15, FFO was once generated in the condition that the load was 19.6 N. However, the FFO disappeared immediately. After that, the load was increased. As soon as the load reached 33.3 N, the friction coefficient dropped down suddenly, and FFO was generated. After that, even when the load was increased, the FFO was continuously generated and kept. As soon as the load reached 56.8 N, sudden increase in friction coefficient was observed, and the tenth friction test was terminated.

Figure 16:
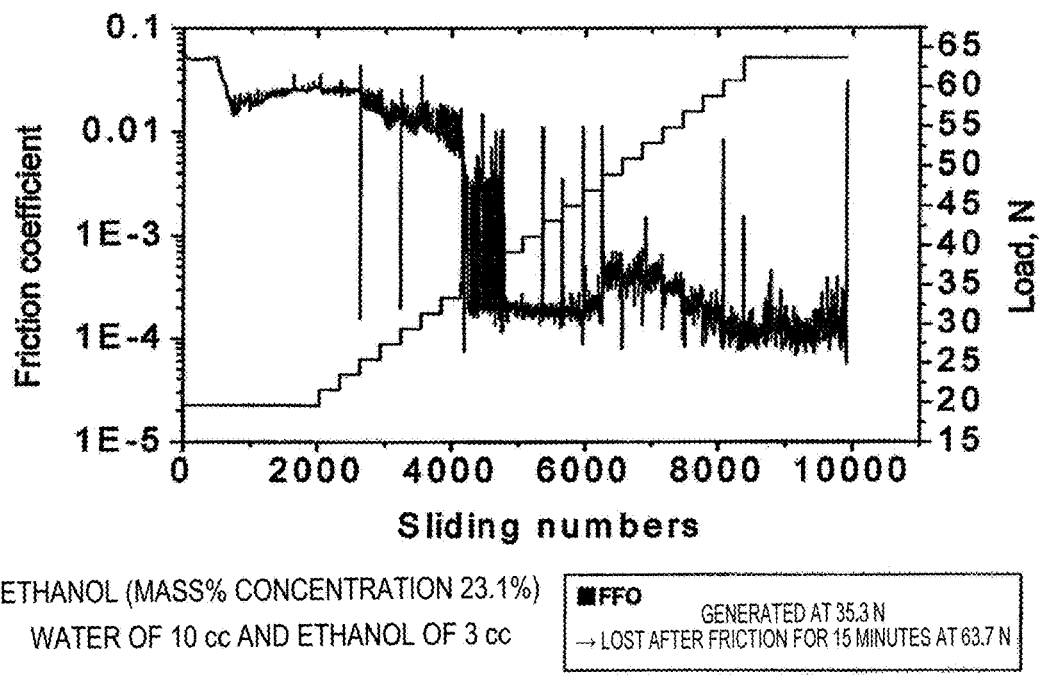
FIG. 16 is a graph showing a relation between an applied load and a measured value of a friction coefficient in the eleventh friction test.

In the eleventh friction test, as shown in FIG. 16, as soon as the load reached 35.3 N, the friction coefficient dropped down suddenly, and FFO was generated. After that, even when the load was increased, the FFO was continuously generated and kept. As soon as the load reached 63.7 N, sudden increase in friction coefficient was observed, and the eleventh friction test was terminated. The FFO was generated for 15 minutes.

Figure 17:
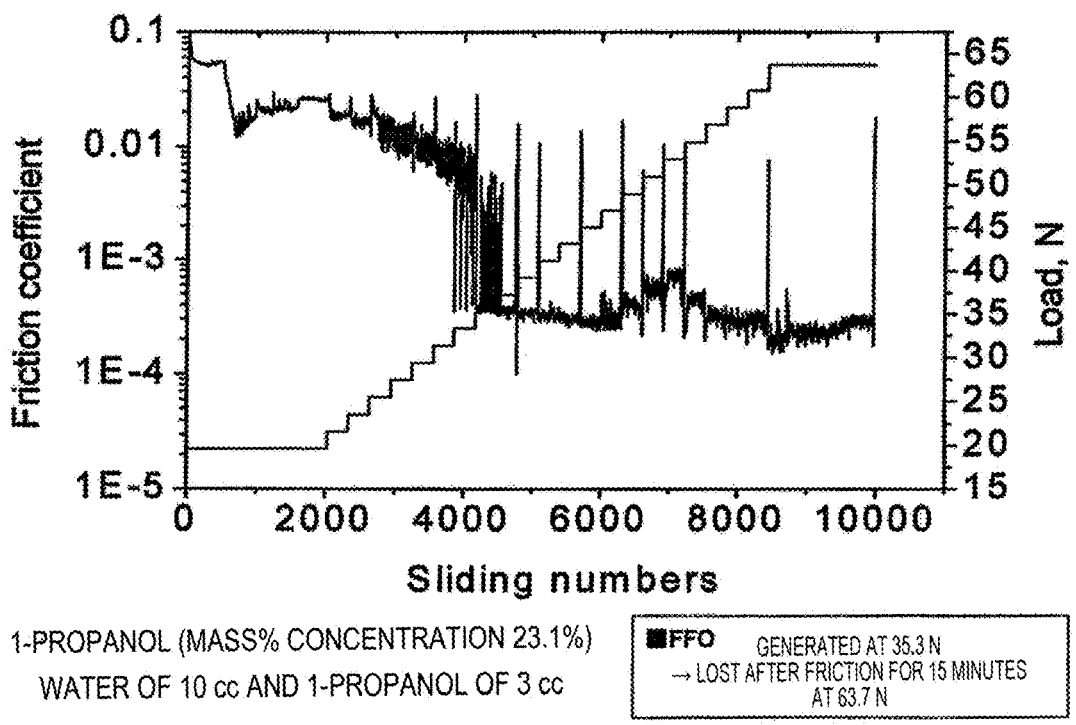
FIG. 17 is a graph showing a relation between an applied load and a measured value of a friction coefficient in the twelfth friction test.

In the twelfth friction test, as shown in FIG. 17, as soon as the load reached 35.3 N, the friction coefficient dropped down suddenly, and FFO was generated. After that, even when the load was increased, the FFO was continuously generated and kept. As soon as the load reached 63.7 N, sudden increase in friction coefficient was observed, and the twelfth friction test was terminated. The FFO was generated for 15 minutes.

Figure 18:
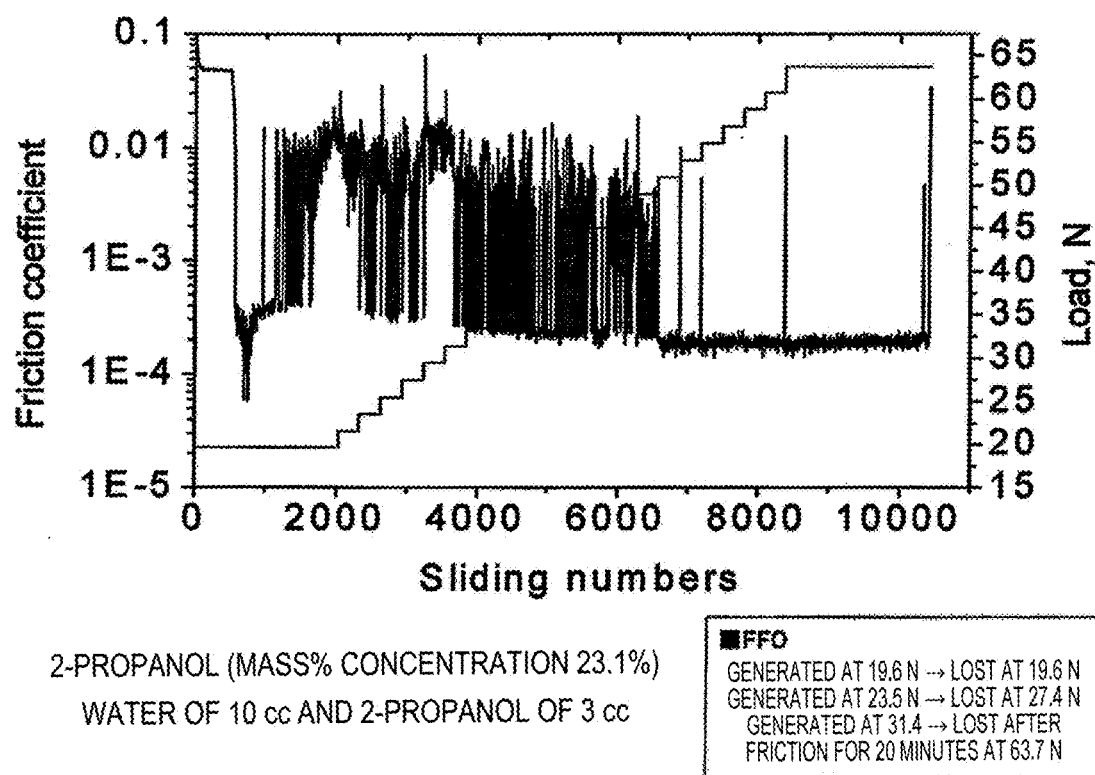
FIG. 18 is a graph showing a relation between an applied load and a measured value of a friction coefficient in the thirteenth friction test.
Figure 19A:
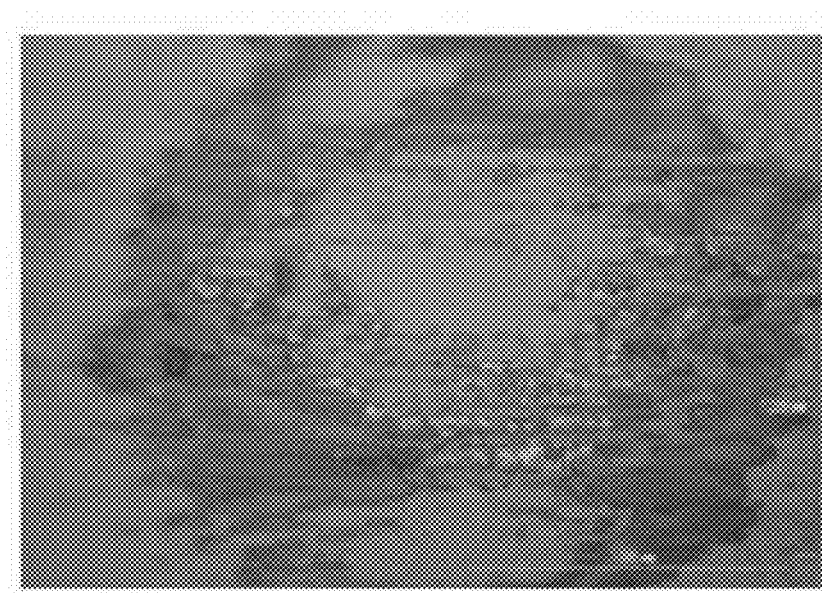
FIGS. 19A and 19B are optical microscope photographic images of an external surface of a pin test piece and an PLC film surface of a plate test piece after termination of the tenth friction test.
Figure 19B:
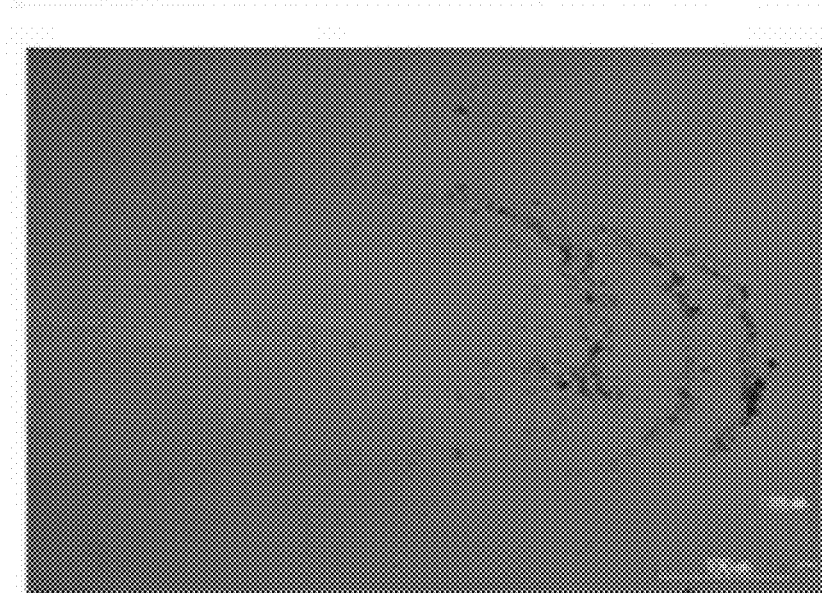
Figure 20A:
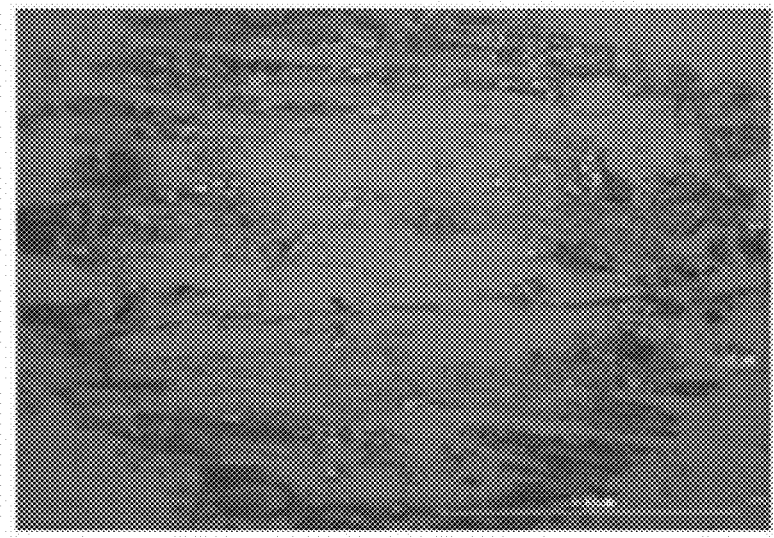
FIGS. 20A and 20B are optical microscope photographic images of an external surface of a pin test piece and an PLC film surface of a plate test piece after termination of the eleventh friction test.
Figure 20B:
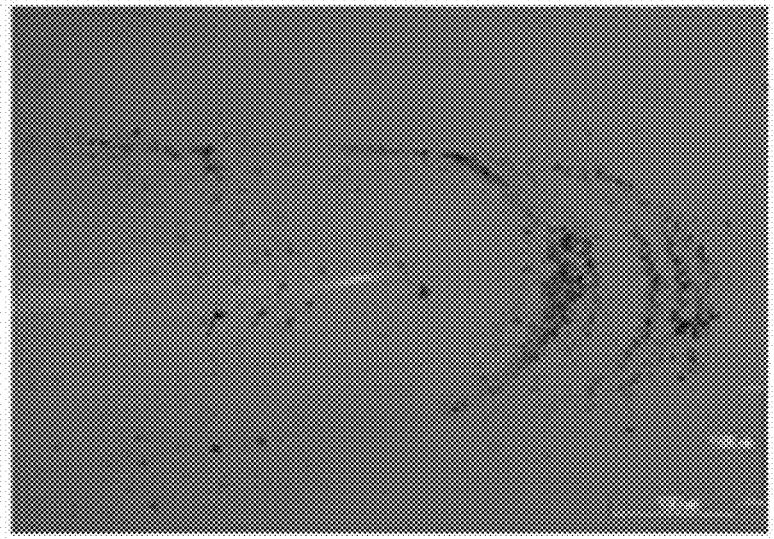

In the thirteen friction test, as shown in FIG. 18, FFO was once generated in the condition that the load was 19.6 N. However, the FFO disappeared immediately. After that, the load is increased. FFO was generated as soon as the load reached 23.5 N. The FFO disappeared when the load reached 23.5 N. After that, the load was increased. As soon as the load reached 31.4 N, FFO was generated again. After that, even when the load was increased, the FFO was continuously generated and kept. As soon as the load reached 63.7 N, sudden increase in friction coefficient was observed, and the thirteenth friction test was terminated. The FFO was generated for 20 minutes within the load range of from 31.4 N to 63.7 N.

From the tenth to thirteenth friction tests, it is understood that FFO can be generated if each of methanol, ethanol, 1-propanol and 2-propanol is used as alcohol.

In addition, FFO can be generated more stably with increase in molecular weight (that is, carbon number) of hydrocarbon in the alcohol (methanol<ethanol<1-propanol=2-propanol).

In addition, FFO was generated more stably in 2-propanol than in 1-propanol, which is an isomer thereof. It can be considered that existence of an OH group in a molecular structure also has influence on stability in generation of FFO.

In the aforementioned first to thirteen friction tests, generation of FFO was observed in the second, fifth to seven, and ninth to thirteenth friction tests. The state in which FFO is thus generated will be described with reference to FIG. 3B.

When the sliding surface 6 slides against the slid surface 7, a comparatively thick frictional polymer film (hereinafter referred to as "FPF") is formed on the sliding surface 6 due to the catalytic effect of the sliding surface 6 made of $ZrO_2$ or the like. The FPF in an early stage of sliding is defined as "FPF-1". The friction coefficient of the FPF-1 is in $10^{-1}$ order. The FPF-1 is a black film, which is a softer film than the PLC film 9. The FPF-1 is formed under a hydrogen gas atmosphere containing alcohol and water.

When the pressing load increases, the maximum Heltzian contact stress in the slid surface 7 also increases. When the pressing load exceeds a predetermined value, the FPF changes in quality. This FPF is defined as "FPF-2". The FPF-2 (corresponding to the "low-friction coating 5") is a transparent film showing interference fringes and having hardness equivalent to that of the PLC film 9. Blisters (bubbles) are formed in the surface of the FPF-2 and inside the FPF-2. From the first to thirteenth examples, the load with which the FPF-1 changes into the FPF-2 is estimated to be around about 12 N. The maximum Heltzian contact stress is 1.3 GPa when the load is 12 N. It is considered that when the maximum Heltzian contact stress reaches about 1.0 GPa, change in quality from FPF-1 to FPF-2 can be started. During sliding when the maximum Heltzian contact stress is lower than 1 GPa, stable FFO cannot be generated. Incidentally, the maximum Heltzian contact stress when the load is 60 N is 2.4 GPa.

FIGS. 19 to 22 are optical microscope photographic images of an external surface of a pin test piece 44 and a surface of an PLC film 9 on a surface of a plate test piece 42 after termination of each of the tenth to thirteenth friction tests. FIGS. 19A, 20A, 21A and 22A show optical microscope photographic images of PLC film 9 surfaces, and FIGS. 19B, 20B, 21B and 22B show optical microscope photographic images of plate test piece 42 surfaces.

From FIGS. 19 to 22, it is understood that different kinds of films are formed on the external surface of the pin test piece 44 when different kinds of alcohols are used.

Figure 21A:
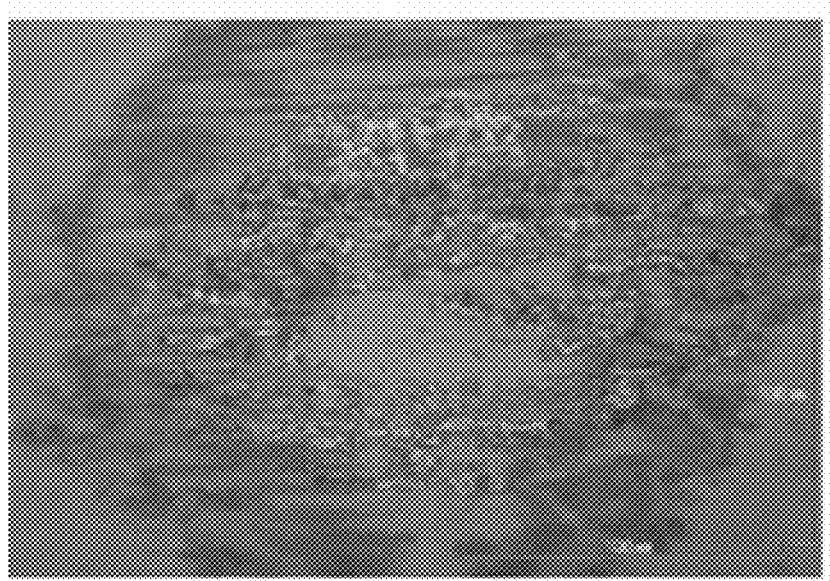
FIGS. 21A and 21B are optical microscope photographic images of an external surface of a pin test piece and an PLC film surface of a plate test piece after termination of the twelfth friction test.
Figure 21B:
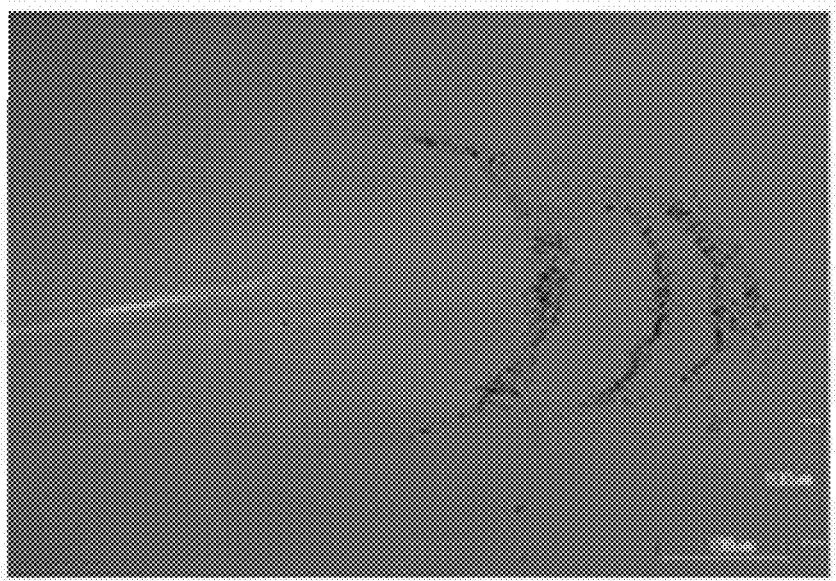
Figure 22A:
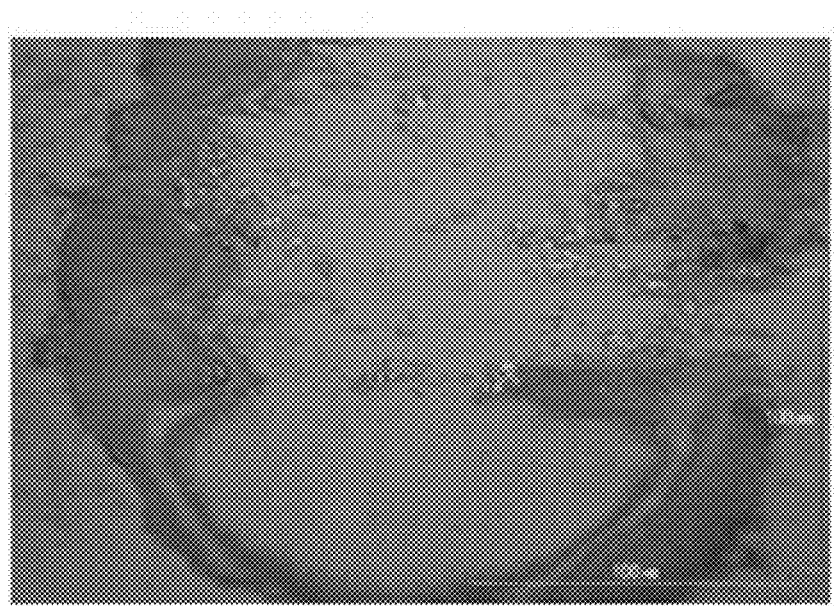
FIGS. 22A and 22B are optical microscope photographic images of an external surface of a pin test piece and an PLC film surface of a plate test piece after termination of the thirteenth friction test.
Figure 22B:
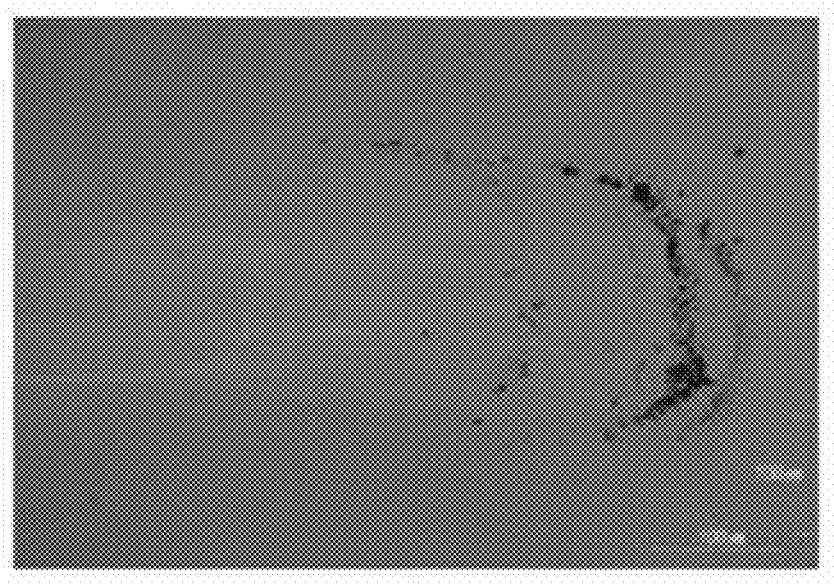

In addition, when 1-propanol was used as alcohol, generation of blisters (bubbles) in the external surface of the pin test piece 44 was observed as shown in FIG. 21A. From this, it can be estimated that a volatile substance (volatile gas) is present near the sliding interface of the external surface of the pin test piece 44.

Next, the fourteenth to twentieth friction tests performed using a second friction tester 141 will be described. The temperature inside the chamber 45 was set at 20° C.±5° C.

Figure 23:
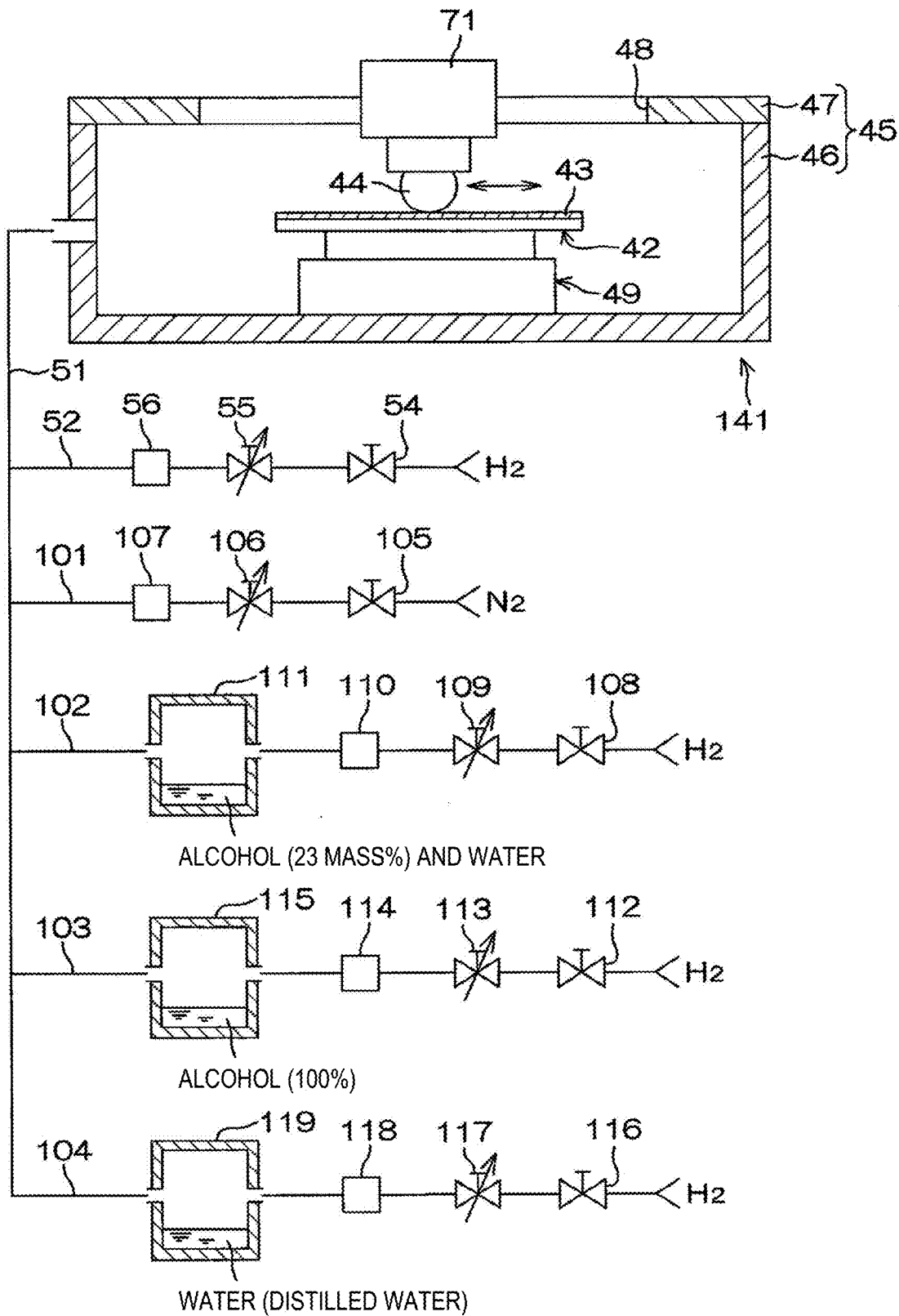
FIG. 23 is a schematic sectional view showing a configuration of a second friction tester.

FIG. 23 is a schematic sectional view showing a configuration of the second friction tester 141. Parts shared between the second friction tester 141 and the first friction tester 41 are referred in the same manner as in FIG. 4, and their description will be omitted. That is, the configuration of the chamber 45 in the second friction tester 141, the configuration of the pin test piece 44, etc. are equivalent to those in the first friction tester 41 without special description. The second friction tester 141 is different from the first friction tester 41 mainly at the point of its gas supply system.

A gas introduction pipe 51 of the gas supply system includes a first line 52, a third line 101, a fourth line 102, a fifth line 103, and a sixth line 104. Hydrogen gas is supplied through the first line 52. Nitrogen gas is supplied through the third line 101. Hydrogen gas as carrier gas containing gaseous alcohol and gaseous steam is supplied through the fourth line 102. Hydrogen gas as carrier gas containing gaseous alcohol but containing no gaseous steam is supplied through the fifth line 103. Hydrogen gas as carrier gas containing gaseous steam but containing no gaseous alcohol is supplied through the sixth line 104.

A third valve 105, a third flow rate regulating valve 106, and a third flowmeter 107 are placed in the third line 101. The third line 101 is opened/closed by the third valve 105. The flow rate of nitrogen gas in the third line 101 is regulated by the third flow rate regulating valve 106. The flow rate of nitrogen gas in the third line 101 is detected by the third flowmeter 107.

A fourth valve 108, a fourth flow rate regulating valve 109, a fourth flowmeter 110, and an alcohol/water vessel 111 are placed in the fourth line 102. The fourth line 102 is opened/closed by the fourth valve 108. The flow rate of hydrogen gas in the fourth line 102 is regulated by the fourth flow rate regulating valve 109. The flow rate of hydrogen gas in the fourth line 102 is detected by the fourth flowmeter 110. Gaseous alcohol and gaseous steam are present in the alcohol/water vessel 111. The temperature in the alcohol/water vessel 111 is set at 20° C.±5° C. In the alcohol/water vessel 111, alcohol and water exist as a solution of liquid alcohol and liquid water, and gaseous alcohol and gaseous steam vaporized from the solution. In the alcohol/water vessel 111, liquid alcohol and liquid water are mixed at a volume ratio of 3:10. "Ethanol and water" contained in treatment gas flowing through the fourth line 102 contains gaseous ethanol and gaseous steam vaporized from the solution in which liquid ethanol and liquid water are mixed at the volume ratio 3:10 in which 3 designates the volume of the liquid ethanol alone which has not been mixed yet and 10 designates the volume of the liquid water alone which has not been mixed yet. The treatment gas obtained thus may be hereinafter referred to as "hydrogen gas (23%@) containing ethanol generated from a solution of 23 vol % ethanol concentration".

A fifth valve 112, a fifth flow rate regulating valve 113, a fifth flowmeter 114, and an alcohol vessel 115 are placed in the fifth line 103. The fifth line 103 is opened/closed by the fifth valve 112. The flow rate of hydrogen gas in the fifth line 103 is regulated by the fifth flow rate regulating valve 113. The flow rate of hydrogen gas in the fifth line 103 is detected by the fifth flowmeter 114. Gaseous alcohol is present in the alcohol vessel 115 where only liquid alcohol (ethanol) is stored. The alcohol vessel 115 has no water but moisture that cannot be eliminated from ethanol. Accordingly, treatment gas flowing through the fifth line 103 substantially contains no water but contains gaseous ethanol. The treatment gas obtained thus may be hereinafter referred to as "hydrogen gas (100%@) containing ethanol generated from a solution of 100 vol % ethanol concentration".

A sixth valve 116, a sixth flow rate regulating valve 117, a sixth flowmeter 118, and a water vessel 119 are placed in the sixth line 104. The sixth line 104 is opened/closed by the sixth valve 116. The flow rate of hydrogen gas in the sixth line 104 is regulated by the sixth flow rate regulating valve 117. The flow rate of hydrogen gas in the sixth line 104 is detected by the sixth flowmeter 118. Gaseous steam is present in the water vessel 119 where only liquid water (distilled water) is stored. The water vessel 119 has no alcohol. Accordingly, treatment gas flowing through the sixth line 104 contains no ethanol but contains gaseous steam. The treatment gas obtained thus may be hereinafter referred to as "hydrogen gas containing water".

When the first valve 54 and the third valve 105 are changed over selectively, a main component of the atmosphere inside the chamber 45 can be changed over between hydrogen and nitrogen. In addition, when at least one of the fourth to sixth valves 108, 112 and 116 is opened, the component ratio between alcohol and water contained in the atmosphere inside the chamber 45 can be controlled. In addition to opening of the valves 108, 112 and 116, the opening degrees of the flow rate regulating valves 109, 113 and 117 can be adjusted to make finer control on the component ratio between alcohol and water contained in the atmosphere inside the chamber 45.

FIG. 24 is a table for explaining upper layers of plate test pieces to be measured in the fourteenth to twentieth friction tests.

Each plate test piece 42 to be measured has a two-layered film 43 on its front surface side. The two-layered film 43 is made of a hard carbon based film having a two-layered structure as described with reference to FIG. 5A. Of the two-layered film 43, an Si-DLC film forming a lower layer has an equivalent configuration to that of the Si-DLC film 62 (see FIG. 5A). On the other hand, of the two-layered film 43, an PLC (Polymer-Like-Carbon) film 163 forming an upper layer (surface layer) is produced in a manner partially different from that of the PLC film 63 (see FIG. 5A).

The production manner of the PLC film 163 is different from the production manner of the PLC film 63 mainly at the point that a high bias voltage (−4.0 kV) is used as a bias voltage in an ionization vapor deposition method (PVD method).

In the fourteenth to twentieth friction tests, three kinds of films, that is, a first PLC film 163A, a second PLC film 163B and a third PLC film 163C were prepared as the PLC films. Nothing was added to the first PLC film 163A (simply "PLC"). Hydrogen was added to the second PLC film 163B (H-PLC). Oxygen was added to the third PLC film 163C (O-PLC). Those films were produced in production manners shown in FIG. 26.

The plate test piece 42 was set in the second friction tester 141 so that the surface where the two-layered film 43 was formed could be used as a surface to be tested. The fourteenth to twentieth friction tests (high load tests repeated up to 28,200 times) were performed to investigate a generation state of FFO while increasing the magnitude of a load applied to the surface of the plate test piece 42 through the pin test piece 44 stepwise by units of 1.96 N within a range of from 19.6 N to 63.7 N under test conditions that the frictional speed was 8.0 mm/s, the frictional stroke was 4.0 mm, and lubrication was absent.

Of the fourteenth to twentieth friction tests, in each of the fourth to seventeenth friction tests, the kind of treatment gas supplied into the chamber 45 and/or the flow rate thereof were changed between a run-in environment between start of the test and generation of FFO and an FFO environment after the generation of FFO.

<Fourteenth Friction Test>

FIG. 25 is a table for explaining test conditions in the fourteenth friction test.

As shown in FIG. 25, in the run-in environment in the fourteenth friction test, nitrogen gas was supplied into the chamber 45 at a high flow rate (5 slm) as a main flow, and hydrogen gas (23%@) containing ethanol generated from a solution of 23 vol % ethanol concentration was supplied at a middle flow rate (180 sccm) as a sub-flow. In the FFO environment, nitrogen gas was supplied into the chamber 45 at a high flow rate (5 slm) as a main flow, and hydrogen gas (23%@) containing ethanol generated from a solution of 23 vol % ethanol concentration was supplied at a low flow rate as a sub-flow, while hydrogen gas (100%@) containing ethanol generated from a solution of 100 vol % ethanol concentration was supplied at a very low flow rate as a sub-flow. Specifically, the supply flow rate of the hydrogen gas (23%@) containing ethanol generated from the solution of 23 vol % ethanol concentration rich in moisture was set at 80 sccm in the beginning of supply, and then decreased gradually to 17 sccm. On the other hand, the supply flow rate of the hydrogen gas (100%@) containing ethanol generated from the solution of 100 vol % ethanol concentration was set at 0.1 sccm in the beginning of supply, and then increased gradually to 0.3 sccm. That is, in the FFO environment where FFO was generated, alcohol concentration and moisture concentration in the atmosphere inside the chamber 45 were controlled to be lower than in the run-in environment. The method in which the alcohol concentration and the moisture concentration are controlled to be low in this manner is effective to generate FFO easily. Incidentally, in the fourteenth friction test, the second PLC film 163B (H-PLC) was used as the plate test piece 42 (see FIG. 5A). However, a plate test piece equivalent to the plate test piece used in each of the first to thirteenth friction tests may be used.

Figure 26:
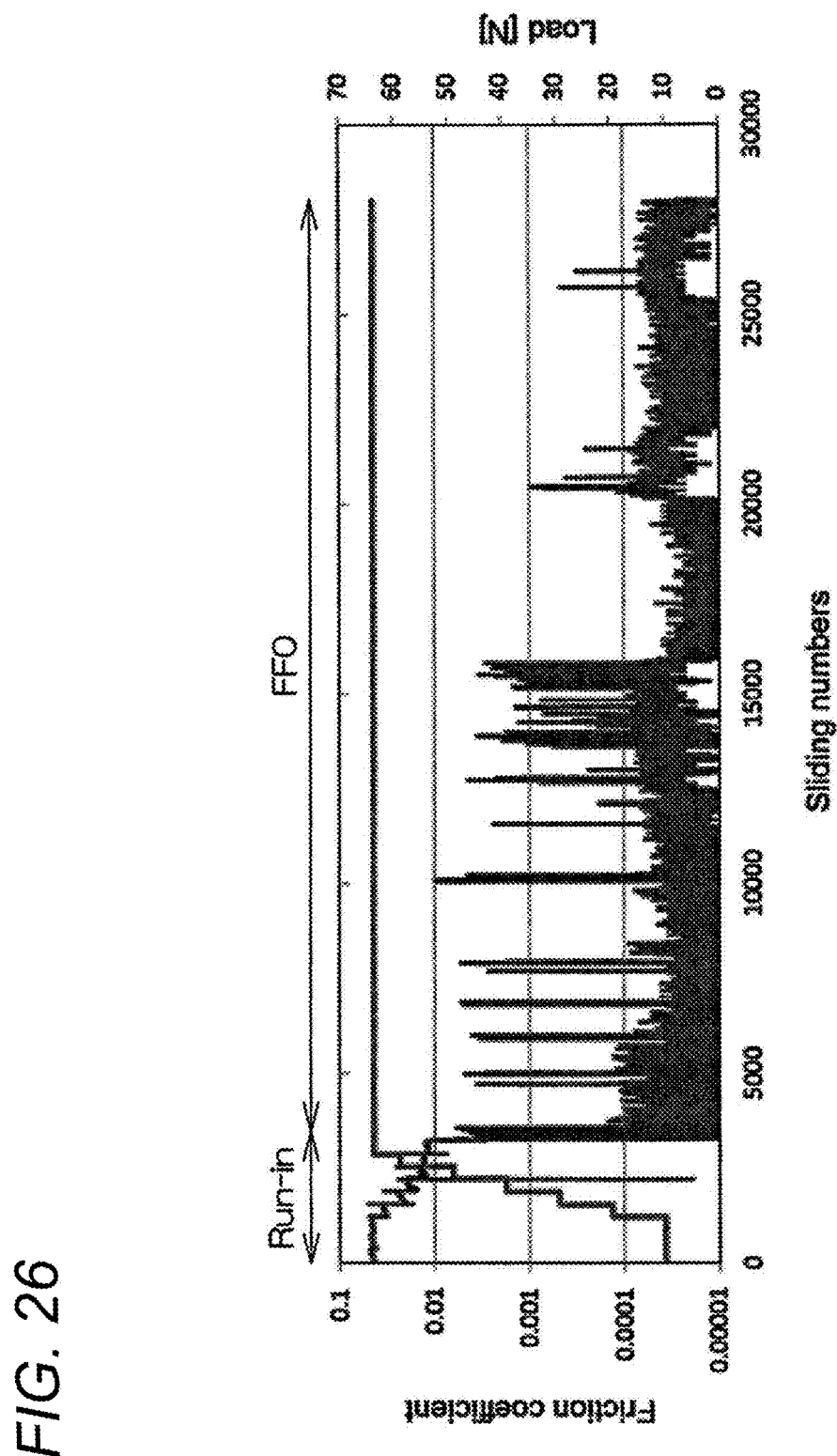
FIG. 26 is a graph showing a relation between an applied load and a measured value of a friction coefficient in the fourteenth friction test.

FIG. 26 is a graph showing a relation between an applied load and a measured value of a friction coefficient in the fourteenth friction test.

In the fourteenth friction test, as shown in FIG. 26, the load was increased stepwise from 9.8 N by units of 9.8 N, and the load was kept at 63.7 N after reaching 63.7 N. When the alcohol concentration and the moisture concentration were controlled to be low at the time when some time has passed since the load reached 63.7 N, the friction coefficient decreased suddenly, and FFO was generated. After that, even when the load was kept at 63.7 N, the FFO was continuously generated and kept. The friction coefficient during the generation of the FFO was not higher than $1\times10^{-4}$. The generation time of the FFO was not shorter than four hours. In the first half (about two hours in the first half) of the FFO environment, momentary increase in friction coefficient was observed repeatedly. When the moisture concentration was controlled to be lower, FFO was generated and kept stably in the second half (about two hours in the second half) of the FFO environment.

From the fourteenth friction test, it is understood that when nitrogen is used as a main flow, that is, when the atmosphere in the chamber 45 has nitrogen as its main component, FFO is generated, and the friction coefficient at that time is very low, while the generation state of the FFO is also good.

<Fifteenth and Sixteen Friction Test>

FIGS. 27A and 27B are tables for explaining test conditions in the fifteenth and sixteenth friction tests.

As shown in FIG. 27A and FIG. 27B, in the run-in environment in the fifteenth and sixteenth friction tests, hydrogen gas was supplied into the chamber 45 at a high flow rate (4.3 slm) as a main flow, and hydrogen gas containing water was supplied at a low flow rate as a sub-flow. In the FFO environment, hydrogen gas was supplied into the chamber 45 at a high flow rate (4.3 slm) as a main flow.

There was a different point between the fifteenth friction test and the sixteenth friction test as follows. That is, in the run-in environment, the supply flow rate of the hydrogen gas containing water was set at 40 (sccm) in the beginning of the test and then decreased gradually to 0 (sccm) in the fifteenth friction test, while the supply flow rate of the hydrogen gas containing water was kept at 40 (sccm) in the sixteenth friction test. On the other hand, in the FFO environment, only the hydrogen gas was supplied as a main flow in the fifteenth friction test, while the hydrogen gas containing water was supplied with its supply flow rate decreased gradually from 40 (sccm) to 10 (sccm) in the sixteenth friction test.

In the fifteenth and sixteenth friction tests, the first PLC film 163A (PLC) was used as the upper layer (surface layer) of the plate test piece 42. On the other hand, not zirconia subjected to no heat treatment but zirconia subjected to heat treatment was used as the material of the pin test piece 44. In the crystal structure of the pin test piece 44 formed of the zirconia subjected to the heat treatment, phase transition takes place from a tetragon to a monocline due to heat so that crystal lattices can be elongated to more effectively provide dissociation in hydrogen molecules or water molecules. Thus, the catalytic effect of the pin test piece 44 made of zirconia can be further enhanced.

Figure 28:
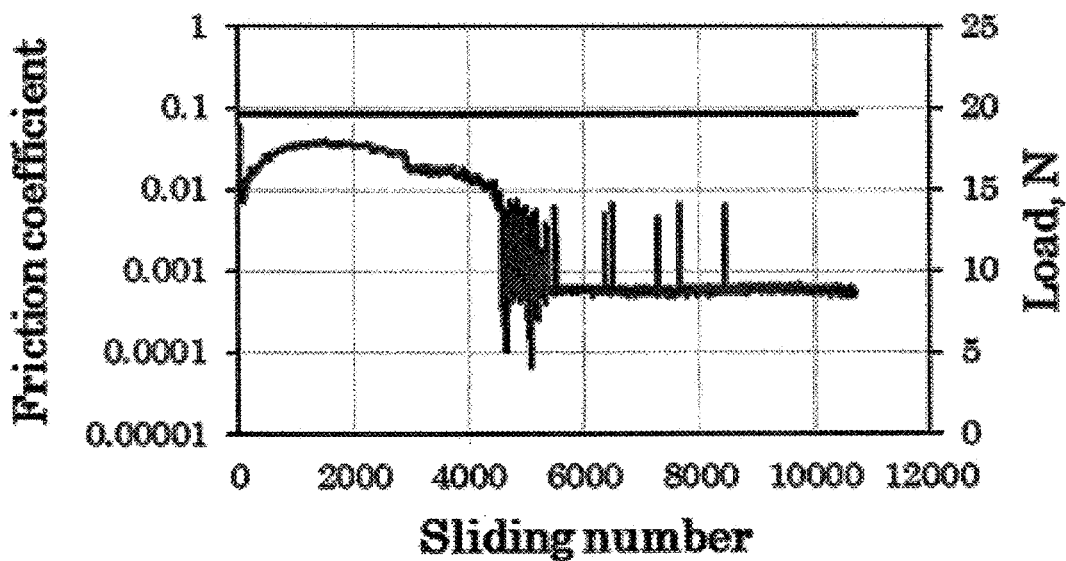
FIG. 28 is a graph showing a relation between an applied load and a measured value of a friction coefficient in the fifteenth friction test.
Figure 29:
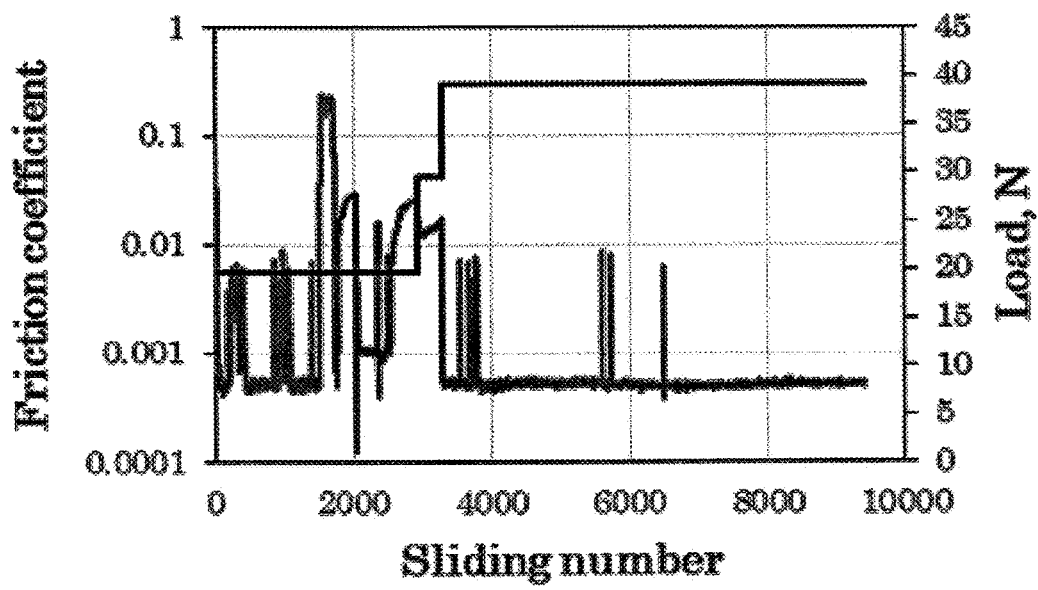
FIG. 29 is a graph showing a relation between an applied load and a measured value of a friction coefficient in the sixteenth friction test.

FIGS. 28 and 29 are graphs showing a relation between an applied load and a measured value of a friction coefficient in the fifteenth and sixteenth friction tests respectively.

In the fifteenth friction test, as shown in FIG. 28, the load was set at 19.6 N in the beginning of the test, and the magnitude of the load was then kept at 19.6 N. When the hydrogen gas containing water was stopped and 45 minutes had passed since the start of the test, the friction coefficient dropped down suddenly, and FFO was generated. After the generation of the FFO was started, the friction coefficient repeated increase and decrease for some time. After that, the generation state of the FFO was stabilized. The friction coefficient during the generation of the FFO was $6\times10^{-4}$. The generation time of the FFO was about one hour.

In the sixteenth friction test, as shown in FIG. 29, the load was set at 19.6 N in the beginning of the test. When 29 minutes had passed since the start of the test, the load was increased to 29.4 N. When 32 minutes had further passed, the load was increased to 39.2 N. After that, the load was kept at 39.2 N. Even when the supply flow rate of the hydrogen gas containing water was 10 (sccm), FFO was generated stably after the load was increased to 39.2 N. The generation time of the FFO was about one hour. The friction coefficient during the generation of the FFO was $5\times10^{-4}$. The generation time of the FFO was about one hour.

From the fifteenth and sixteenth friction tests, it is understood that FFO can be generated even when ethanol is absent from the atmosphere inside the chamber 45. In addition, it is also understood that the load resistance of the film (first PLC film 163A) can be enhanced when a small amount of moisture is contained in the atmosphere in the FFO environment even if ethanol (alcohol) is absent from the atmosphere in the run-in environment.

<Seventeenth Friction Test>

FIGS. 30A and 30B are tables for explaining test conditions in the seventeenth friction test.

As shown in FIG. 30A and FIG. 30B, in the run-in environment in the seventeenth friction test, hydrogen gas was supplied into the chamber 45 at a high flow rate (4.3 slm) as a main flow, and hydrogen gas (100%@) containing ethanol generated from a solution of 100 vol % ethanol concentration was supplied at a very low flow rate (2 sccm) as a sub-flow. On the other hand, in the FFO environment, nitrogen gas was supplied into the chamber 45 at a high flow rate (4.3 slm) as a main flow, and the hydrogen gas (100%@) containing ethanol generated from the solution of 100 vol % ethanol concentration was supplied at a very low flow rate (1 sccm) as a sub-flow. In the seventeenth friction test, the first PLC film 163A (PLC) was used as the upper layer (surface layer) of the plate test piece 42.

Figure 31:
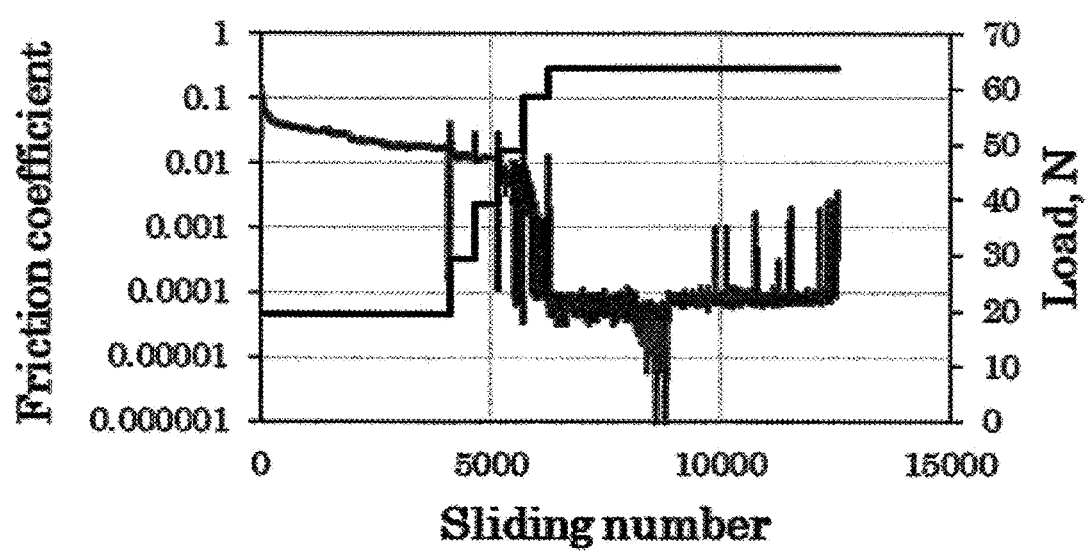
FIG. 31 is a graph showing a relation between an applied load and a measured value of a friction coefficient in the seventeenth friction test.

FIG. 31 is a graph showing a relation between an applied load and a measured value of a friction coefficient in the seventeenth friction test.

In the seventeenth friction test, as shown in FIG. 31, the load was kept at 19.6 N until 40 minutes had passed since the start of the test. After that, the load was increased from 19.6 N stepwise by units of 9.8 N. After the load reached 63.7, the load was kept at 63.7 N. Around the time when the load reached about 50 N, the friction coefficient dropped down suddenly, and FFO was generated. After that, a large up/down motion was observed in the value of the friction coefficient. After the load reached 63.7 N, the FFO was generated and kept stably. The friction coefficient during the generation of the FFO was generally not higher than $1 \times 10^{-4}$. The generation time of the FFO was about one hour.

From the seventeenth friction test, it is understood that FFO can be generated well even when water ($H_2O$) is absent from the atmosphere inside the chamber 45, that is, even when ethanol is used as a hydroxyl group containing compound. Incidentally, although ethanol was used as alcohol in the seventeenth friction test, it can be estimated that a similar result can be obtained even when another alcohol such as methanol, 1-propanol, 2-propanol, etc. is used.

Next, the eighteenth to twentieth friction tests will be described. There is a difference in the upper layer (surface layer) of the plate test piece 42 among the eighteenth to twentieth friction tests.

<Eighteenth Friction Test>

The third PLC film 163C (O-PLC) was used as the upper layer (surface layer) of the plate test piece 42. Without distinction of the run-in environment and the FFO environment, hydrogen gas was supplied into the chamber 45 at a high flow rate (4.3 slm) as a main flow, and hydrogen gas (100%@) containing ethanol generated from a solution of 100 vol % ethanol concentration and hydrogen gas containing water were supplied at low flow rates (40 sccm and 10 sccm respectively).

<Nineteenth Friction Test>

The first PLC film 163A (PLC) was used as the upper layer (surface layer) of the plate test piece 42. Without distinction of the run-in environment and the FFO environment, hydrogen gas was supplied into the chamber 45 at a high flow rate (4.3 slm) as a main flow, hydrogen gas (23%@) containing ethanol generated from a solution of 23 vol % ethanol concentration was supplied at a middle flow rate (180 sccm), and hydrogen gas (100%@) containing ethanol generated from a solution of 100 vol % ethanol concentration was supplied at a very low flow rate (2 sccm).

<Twentieth Friction Test>

The second PLC film 163B (H-PLC) was used as the upper layer (surface layer) of the plate test piece 42. Without distinction of the run-in environment and the FFO environment, hydrogen gas was supplied into the chamber 45 at a high flow rate (4.3 slm) as a main flow, and hydrogen gas (23%@) containing ethanol generated from a solution of 23 vol % ethanol concentration was supplied at middle flow rate (180 sccm).

Figure 33:
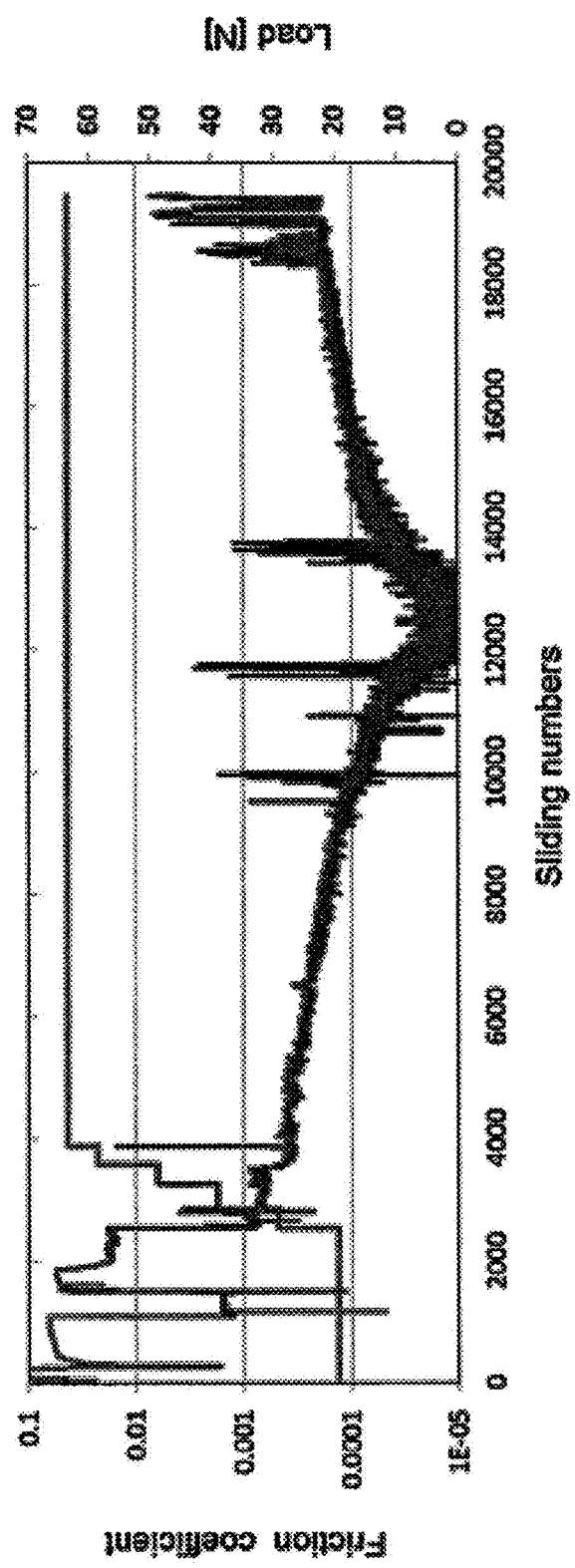
FIG. 33 is a graph showing a relation between an applied load and a measured value of a friction coefficient in the eighteenth friction test.
Figure 34:
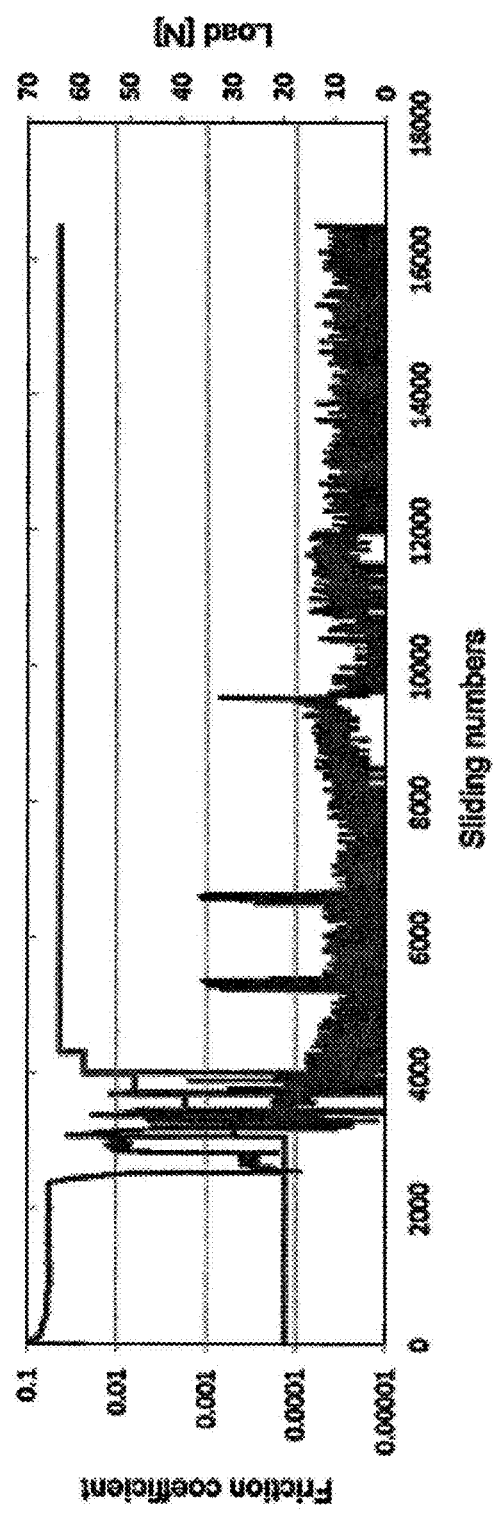
FIG. 34 is a graph showing a relation between an applied load and a measured value of a friction coefficient in the nineteenth friction test.
Figure 35:
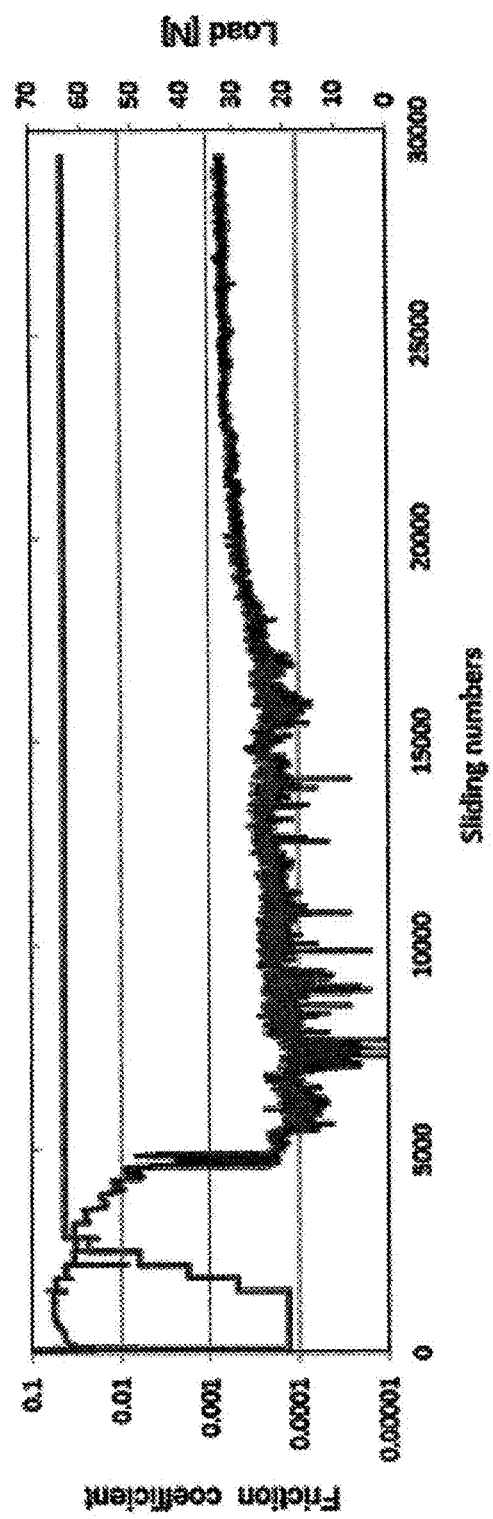
FIG. 35 is a graph showing a relation between an applied load and a measured value of a friction coefficient in the twentieth friction test.

FIGS. 33 to 35 are graphs showing a relation between an applied load and a measured value of a friction coefficient in the eighteenth to twentieth friction tests.

In the eighteenth friction test, as shown in FIG. 33, the load was increased from 19.6 N stepwise by units of 9.8 N. After the load reached 63.7 N, the load was kept at 63.7 N. In a state where alcohol concentration and moisture concentration had been controlled to be low, FFO was generated when the load was increased to 29.4 N from 19.6 N. Even when the load was increased to 63.7 N, the FFO was kept. The friction coefficient in an early stage of the FFO when the load was 63.7 was $5 \times 10^{-4}$. As time went, the friction coefficient dropped down, and decreased to be not higher than about $1 \times 10^{-4}$. After that, the friction coefficient increased gradually. The generation time of the FFO was not shorter than 2 hours.

In the nineteenth friction test, as shown in FIG. 34, the load was increased from 19.6 N stepwise by units of 9.8 N. After the load reached 63.7 N, the load was kept at 63.7 N. In a state where alcohol concentration and moisture concentration had been controlled to be low, the friction coefficient dropped down suddenly and FFO was generated as soon as 23 minutes had passed since the start of the test. After that, the load was increased stepwise by units of 9.8 N. After the load reached 63.7 N, the load was kept at 63.7 N. When the load was increased to 39.2 N, FFO was generated stably. Even when the load was 63.7 N, the FFO was generated stably. The friction coefficient during the generation of the FFO showed a low value not higher than about $1 \times 10^{-4}$. The generation time of the FFO was not shorter than 2 hours.

In the twentieth friction test, as shown in FIG. 35, the load was increased from 19.6 N stepwise by units of 9.8 N. After the load reached 63.7 N, the load was kept at 63.7 N. In a state where alcohol concentration and moisture concentration had been controlled to be low, the friction coefficient dropped down suddenly and FFO was generated as soon as 30 minutes had passed since the start of the test. The friction coefficient in an early stage of the FFO was about $1 \times 10^{-4}$. However, the friction coefficient increased gently as time went, due to temperature drift of a friction force measuring sensor. It was estimated that the friction coefficient of the FFO would be in a range of $1 \times 10^{-4}$ to $4 \times 10^{-4}$ if the temperature drift of the friction sensor were absent. The generation time of the FFO was not shorter than 4 hours.

From the eighteenth to twentieth friction tests, it is understood that FFO can be generated well in any case where the first PLC film 163A (PLC), the second PLC film 163B (H-PLC) or the third PLC film 163C (O-PLC) is used as the upper layer (surface layer) of the plate test piece 42.

From above, according to the embodiment, the sliding surface 6 which is formed of metal (SUJ2, palladium, or the like) or oxide ceramic ($ZrO_2$) is slid against the slid surface 7 including the PLC film 9 which is a coating formed by an ionization vapor deposition method with a bias voltage applied thereto, by Heltzian contact stress not lower than 1.0 GPa under an atmosphere environment of alcohol and/or hydrogen gas containing a very small amount of water and/or nitrogen gas (to say further, the environment containing no oxygen). The metal (SUJ2, palladium, or the like) or oxide ceramic ($ZrO_2$) forming the sliding surface 6 has catalytic properties capable of dissociating and adsorbing hydrogen molecules to thereby generate active hydrogen. As a result of sliding the sliding surface 6 against the PLC film 9, the active hydrogen can be provided in the sliding interface due to the catalytic effect of the sliding surface 6. The alcohol contained in the atmosphere of the internal space 10 is hydrocracked by the acid catalytic effect of the active hydrogen in the sliding surface 6. Thus, FFO can be generated. In addition, due to the existence of water, the catalytic effect of the sliding surface 6 can be stabilized by the water.

In this manner, the low-friction coating 5 having an extremely low friction coefficient in $10^{-4}$ order (lower than 0.001) can be formed on the sliding surface 6. The low-friction coating 5 exhibits the extremely low friction coefficient stably.

In addition, it is possible to reduce the friction coefficient of the sliding surface 6 without using any additional lubricant.

Further, since the friction coefficient of the sliding surface 6 can be reduced extremely, a friction force generated between the sliding surface 6 and the slid surface 7 can be reduced without using any additional lubricant. As a result, frictional loss caused by the sliding of the sliding system 1 can be reduced on a large scale (friction torque can be reduced on a large scale). Accordingly, it is possible to reduce the size and weight of the sliding system 1, and it is possible to improve the reliability of the sliding system 1.

In addition, the invention can be implemented with another embodiment.

For example, the PLC film 9 containing short-chain polyacetylene based molecules as major component may contain other hydrocarbon molecules as major component.

In addition, although description has been made on the assumption that the PLC film 9 is formed by an ionization vapor deposition method with a low bias voltage or a high bias voltage applied thereto under an atmosphere environment of hydrocarbon based gas, the PLC film 9 may be a coating formed by another method.

In addition, an alcohol/water supply state in which alcohol and water are supplied into the internal space 10 and a supply stop state in which supplying the alcohol and the water into the internal space 10 is stopped may be repeated alternately in parallel with the sliding of the sliding surface 6 against the slid surface 7.

When supplying the alcohol and the water into the chamber 12 is stopped, moisture (water) capable of serving as poison in catalyst can be eliminated from the atmosphere in the chamber 12, as described previously. On the other hand, there is a fear that stopping supplying the alcohol and the water may lead to depletion of ethanol and water in the sliding surface 6 (sliding interface).

When the alcohol/water supply state and the supply stop state are repeated alternately, it is possible to continuously supply ethanol and water to the sliding surface 6 (sliding interface) while suppressing the water from serving as poison in catalyst.

In addition, treatment gas supplied into the internal space 10 of the chamber 12 through the inlet port 32 of the treatment gas introduction pipe 19 contains at least one of nitrogen gas and hydrogen gas as main flow. In addition, the treatment gas contains a very small amount of at least one of alcohol and water.

That is, main gas (at least one of nitrogen gas and hydrogen gas) may contain both alcohol and water, or may contain alcohol but no water, or may contain water but no alcohol. In addition, although alcohol is used as an example of a hydrocarbon based substance, another hydrocarbon based substance (such as methane, ethane, propane, butane, acetylene, ethylene, or carboxylic acid (acetic acid, formic acid, etc.)) may be used in place of the alcohol.

In addition, the atmosphere in the internal space 10 of the chamber 12 may contain hydrogen gas mainly or may contain nitrogen gas mainly.

Further, various changes in design can be made within the scope of items stated in the claims.

The present application is based on a Japanese patent application (Japanese Patent Application No. 2015-015850) filed on Jan. 29, 2015, a Japanese patent application (Japanese Patent Application No. 2015-015851) filed on Jan. 29, 2015, a Japanese patent application (Japanese Patent Application No. 2016-008236) filed on Jan. 19, 2016, and a Japanese patent application (Japanese Patent Application No. 2016-008237) filed on January 19, the contents of which are incorporated herein by reference.

DESCRIPTION OF REFERENCE SIGNS

1 . . . sliding system, 5 . . . low-friction coating, 6 . . . sliding surface, 7 . . . slid surface, 9 . . . PLC film (amorphous carbon based film), 10 . . . internal space (space)

The invention claimed is:

1. A method for producing a coating, comprising:
substituting an atmosphere in a space, in which a sliding surface formed of a metal or a ceramic material, and a slid surface including an amorphous carbon based film are disposed, with a gas atmosphere containing a hydroxyl group-containing compound and at least one of hydrogen and nitrogen; and
relatively sliding the sliding surface against the slid surface by a Hertzian contact stress of 1.0 GPa or more in the space under the gas atmosphere containing the hydroxyl group-containing compound and at least one of hydrogen and nitrogen,
wherein the coating is formed on the sliding surface by the sliding.

2. The method for producing a coating according to claim 1,
wherein the gas atmosphere further comprises a hydrocarbon based substance.

3. The method for producing a coating according to claim 2,
wherein the hydroxyl group-containing compound and the hydrocarbon based substance comprise an alcohol.

4. The method for producing a coating according to claim 3,
wherein the alcohol comprises methanol.

5. The method for producing a coating according to claim 4, wherein:
the hydroxyl group-containing compound further comprises water, and
the gas atmosphere contains gaseous methanol and gaseous steam generated from a solution in which vol % concentration of liquid methanol to the liquid methanol and liquid water is in a range of from 6% to 15%.

6. The method for producing a coating according to claim 4, wherein:
the hydroxyl group-containing compound further contains water,
the methanol flows in a gaseous state due to a first carrier gas,
the water flows in a gaseous state due to a second carrier gas, and
a ratio of a flow rate of the first carrier gas comprising the gaseous methanol to a total of the flow rate of the first carrier gas comprising the gaseous methanol and a flow rate of the second carrier gas comprising the gaseous water is in a range of from 6% to 15%.

7. The method for producing a coating according to claim 3, wherein the alcohol comprises ethanol.

8. The method for producing a coating according to claim 7, wherein:
the hydroxyl group-containing compound further contains water, and
the gas atmosphere contains gaseous ethanol and gaseous steam generated from a solution in which vol % concentration of liquid ethanol to the liquid ethanol and liquid water is in a range of from 6% to 30%.

9. The method for producing a coating according to claim 8,
wherein the gas atmosphere contains gaseous ethanol and gaseous steam generated from a solution in which vol % concentration of the liquid ethanol to the liquid ethanol and the liquid water is in a range of from 15% to 25%.

10. The method for producing a coating according to claim 7, wherein:
the hydroxyl group-containing compound further contains water,
the ethanol flows in a gaseous state due to a first carrier gas,
the water flows in a gaseous state due to a second carrier gas, and
a ratio of a flow rate of the first carrier gas comprising the gaseous ethanol to a total of the flow rate of the first carrier gas comprising the gaseous ethanol and a flow rate of the second carrier gas comprising the gaseous water is in a range of from 6% to 30%.

11. The method for producing a coating according to claim 10,
wherein the ratio of the flow rate of the first carrier gas comprising the gaseous ethanol to the total of the flow rate of the first carrier gas comprising the gaseous ethanol and the flow rate of the second carrier gas comprising the gaseous water is in a range of from 15% to 25%.

12. The method for producing a coating according to claim 3,
wherein the alcohol comprises 1-propanol.

13. The method for producing a coating according to claim 3,
wherein the alcohol comprises 2-propanol.

14. The method for producing a coating according to claim 3,
wherein the hydroxyl group-containing compound is gaseous alcohol generated from a solution containing the alcohol at a ratio of 100%.

15. The method for producing a coating according to claim 2, wherein the hydrocarbon based substance comprises ethylene.

16. The method for producing a coating according to claim 1,
wherein the hydroxyl group-containing compound contains water.

17. The method for producing a coating according to claim 1,
wherein the Hertzian contact stress is 1.3 GPa to 2.4 GPa.

18. The method for producing a coating according to claim 1,
wherein the amorphous carbon based film contains polyacetylene based molecules as a major component.

19. The method for producing a coating according to claim 1,
wherein the amorphous carbon based film comprises a coating formed by an ionization vapor deposition method with a bias voltage applied thereto under an atmosphere environment of hydrocarbon based gas.

20. The method for producing a coating according to claim 19, wherein:
when the bias voltage is higher than a predetermined bias voltage, at least one of hydrogen and oxygen is added to the amorphous carbon based film.

21. The method for producing a coating according to claim 1,
wherein the sliding member is formed of $ZrO_2$.

22. The method for producing a coating according to claim 1, further comprising:
supplying the hydroxyl group-containing compound into the space; and
stopping supply of the hydroxyl group-containing compound into the space after start of the sliding.

23. The method for producing a coating according to claim 1, further comprising:
alternately and repeatedly supplying the hydroxyl group-containing compound into the space, and stopping supply of the hydroxyl group-containing compound into the space while performing the sliding.

24. A sliding method comprising:
substituting an atmosphere in a space, in which a sliding surface formed of a metal or a ceramic material, and a slid surface are disposed, with a gas atmosphere containing a hydroxyl group-containing compound and at least one of hydrogen and nitrogen; and
relatively sliding the sliding surface against the slid surface by a Hertzian contact stress of 1.0 GPa or more in a state where the atmosphere in the space has been substituted with the gas atmosphere containing the hydroxyl group-containing compound and at least one of hydrogen and nitrogen.

* * * * *